United States Patent [19]
Fujisawa et al.

[11] Patent Number: 5,331,209
[45] Date of Patent: Jul. 19, 1994

[54] AUTO-RESET CIRCUIT WITH IMPROVED TESTABILITY

[75] Inventors: Yoshimitu Fujisawa, Osaka; Yasuhiro Shin, Tokyo, both of Japan

[73] Assignee: Oki Electric Industry Co., Ltd., Tokyo, Japan

[21] Appl. No.: 23,674

[22] Filed: Feb. 26, 1993

[30] Foreign Application Priority Data

Feb. 28, 1992 [JP] Japan ................................ 4-043743

[51] Int. Cl.⁵ .......................... H03K 3/01; H03K 3/12
[52] U.S. Cl. ............................ 307/296.4; 307/272.3; 307/264; 307/296.1
[58] Field of Search ............ 307/272.3, 296.1, 296.4, 307/264

[56] References Cited

U.S. PATENT DOCUMENTS

| | | | |
|---|---|---|---|
| 4,001,609 | 1/1977 | Sickert | 307/268 |
| 4,533,837 | 8/1985 | Tanaka et al. | 307/116 |
| 4,804,929 | 2/1989 | Kato et al. | 331/57 |

FOREIGN PATENT DOCUMENTS

| | | | |
|---|---|---|---|
| 0165855A1 | 12/1985 | European Pat. Off. | |
| 0342735A1 | 11/1989 | European Pat. Off. | |
| 2520822 | 11/1976 | Fed. Rep. of Germany | |
| 2539869 | 3/1977 | Fed. Rep. of Germany | |
| 54-19640 | 2/1979 | Japan | H03K 3/02 |
| 0032716 | 2/1979 | Japan | 307/272.3 |
| 54-152817 | 12/1979 | Japan | G06F 1/00 |
| 57-157633 | 9/1982 | Japan | H03K 17/22 |
| 57-183125 | 11/1982 | Japan | H03K 17/22 |
| 61025318 | 11/1982 | Japan | |
| 60-191323 | 9/1985 | Japan | G06F 1/00 |
| 62-68336 | 4/1987 | Japan | H03K 17/22 |
| 63-234720 | 9/1988 | Japan | H03K 17/22 |
| 1032716 | 2/1989 | Japan | |
| 1-78520 | 3/1989 | Japan | H03K 17/22 |
| 1-307315 | 12/1989 | Japan | H03K 17/22 |
| 3-206709 | 9/1991 | Japan | H03K 17/22 |

Primary Examiner—Margaret R. Wambach
Attorney, Agent, or Firm—Edward D. Manzo

[57] ABSTRACT

A first active element has its first terminal coupled to a first power-supply terminal, its second terminal coupled through a resistor to a second power-supply terminal, and its third terminal coupled to the second power-supply terminal, or to a control signal input terminal that is normally at the same potential as the second power-supply terminal. A second active element has its first terminal coupled to the second power-supply terminal, its second terminal coupled through a resistor to the first power-supply terminal, and its third terminal coupled to the second terminal of the first active element. A reset signal is taken from the second terminal of the second active element. The control signal can be used to prevent current flow during static current measurements.

16 Claims, 45 Drawing Sheets

AUTO-RESET CIRCUIT WITH IMPROVED TESTABILITY

BACKGROUND OF THE INVENTION

This invention relates to an auto-reset circuit used to initialize an electronic circuit when the electronic circuit is powered up, or when its power supply is momentarily interrupted.

When a complex electronic device such as a large-scale-integrated (LSI) circuit is powered up, it must generally be reset by placing its internal circuits in certain initial states. The device must also be reset if its power supply is interrupted during operation, as sometimes happens due to temporary conditions. For these purposes, LSI and other devices often have an auto-reset circuit that detects the rise of the power supply and generates an internal reset signal.

Many types of auto-reset circuits can be found in the prior art. One of the simplest comprises a resistor and capacitor coupled in series between the two power-supply terminals, which are commonly referred to as power and ground, or $V_{DD}$ and $V_{SS}$. The reset signal is taken from a point between the resistor and capacitor. At power-up the reset signal starts with the value of one of the two power-supply potentials, then changes to the value of the other as the capacitor charges. The reset signal can be used directly, or it can be used to drive an output stage such as an inverter or Schmitt trigger. A disadvantage of this simple auto-reset circuit is that it fails to produce a reset signal if the supply voltage rises slowly in comparison to the resistor-capacitor time constant, or if power is interrupted for an interval that is brief in relation to that time constant.

To overcome the disadvantages of this simple circuit, many auto-reset circuits incorporating active elements have been developed. The one that comes closest to the present invention has a p-channel metal-oxide-semiconductor field-effect transistor (referred to below as a P-MOSFET) and a resistor coupled in series between the power-supply terminals, the source of the P-MOSFET being coupled to $V_{DD}$ and its drain to the resistor. An n-channel metal-oxide-semiconductor field-effect transistor (referred to below as an N-MOSFET) and another resistor are also coupled in series between the power-supply terminals, the source of the N-MOSFET transistor being coupled to $V_{SS}$ and its drain to the resistor. The gates of both the P-MOSFET and N-MOSFET are coupled to the drain of the P-MOSFET. The reset signal is output from the drain of the N-MOSFET.

This circuit produces a reset signal that is initially high, but goes low when the supply voltage reaches a value equal to the sum of the threshold voltages of the two MOSFETs. With the traditional five-volt power supply, the reset signal is typically output while the supply voltage rises from zero to about 1.4 V, then released as the supply voltage rises from 1.4 V to a steady-state 5 V.

The recent trend toward three-volt operation has created a problem for this auto-reset circuit, however. The problem arises, for example, during device tests carried out prior to shipment to the customer. Consider a device specified to operate reliably on a 3.0-V ±10% power supply over a temperature range of −40° C. to +85° C. The nominal transistor threshold voltage is 0.7 V, but there is a variability of about ±0.25 V inherent in the fabrication process, and further variability results from the temperature dependence of the threshold voltage, so within the above temperature range the threshold voltage may be as high as 1.2 V. If both the P-MOSFET and N-MOSFET have this threshold voltage, then the reset signal will not be released until the supply voltage reaches at least 2.4 V.

This would not necessarily be a problem if tests were carried out with supply voltages between 2.7 V and 3.3 V, but to prevent degradation of circuit elements, tests may be performed at a reduced supply voltage such as 2.4 V. When the device is powered up to this voltage, the auto-reset circuit may fail to release the reset signal, causing the device to be rejected as defective. To allow a reasonable margin in such tests, the auto-reset circuit needs to release the reset signal at about 1.9 V.

The problem becomes even more serious at lower supply voltages, such as the 1.8 V supply voltage employed in devices driven by two-nickel-cadmium cells. For such devices the auto-reset circuit described above is completely unsatisfactory.

Another problem that occurs in device testing is that current flow through the above auto-reset circuit cannot be reduced to zero. One of the tests performed to detect photolithography defects and other defects is a measurement of static current consumption ($I_{DD}$). The presence of current flow through the auto-reset circuit impairs the precision of this measurement, because the exact amount of current flowing through the auto-reset circuit is unknown. Also, it becomes impossible to characterize the device down to extremely small current values. Thus the test fails to screen out devices having minor defects that may lead to failure in the field.

Yet another problem of the above auto-reset circuit is that in some cases it may generate a reset signal with an inadequate pulse width, or fail to output a reset signal at all. This problem occurs not only at power-up, but also when the supply voltage drops momentarily during operation, then recovers. It occurs particularly when the supply voltage rises rapidly (in a few hundred nanoseconds, for example), and the reset signal must drive a significant capacitive load.

In many devices the internal reset signal does drive a significant capacitive load, because there are many internal circuits to be reset. If the reset signal is routed to those circuits directly, the capacitance of the signal-line wiring is large. If buffers are used, the reset signal must drive the input capacitance of the buffers. A capacitive load on the order of half a picofarad is typical. If the resistor through which the reset signal is output has sufficient resistance to hold current flow through the auto-reset circuit to about ten microamperes during the steady state, and the power supply rises to five volts in a few hundred nanoseconds, then the reset signal will be released while the capacitive load is still charging and the reset signal is still inactive.

This problem could be alleviated by reducing the resistance value of the resistor, but then more current would flow through the circuit during steady-state operation. If the current flow is too high, problems such as excessive power consumption and battery drain arise.

SUMMARY OF THE INVENTION

It is accordingly an object of the present invention to ensure release of the reset signal, even in devices with a low supply voltage.

Another object of the invention is to ensure that an adequate reset signal is generated even if the power-supply potential rises rapidly.

Yet another object of the invention is to ensure that a reset signal is output when the power supply is interrupted, even if the interruption is momentary.

Still another object of the invention is to avoid needlessly high current drain during operation.

A further object of the invention is to enable current drain through the auto-reset circuit to be reduced to zero for testing purposes.

An auto-reset circuit according to a first aspect of the invention comprises first and second power-supply terminals for receiving two different power-supply potentials, an output terminal for output of a reset signal, a first active element, and a second active element.

The first active element has three terminals, the third terminal controlling conduction between the first and second terminals. The first terminal is coupled to the first power-supply terminal, the second terminal is coupled through a resistor to the second power-supply terminal, and the third terminal is coupled directly to the second power-supply terminal.

The second active element similarly has three terminals, the third terminal controlling conduction between the first and second terminals. The first terminal is coupled to the second power-supply terminal, the second terminal is coupled to the output terminal and through a resistor to the first power-supply terminal, and the third terminal is coupled to the second terminal of the first active element.

This first aspect of the invention assures release of the reset signal even at low power-supply voltages.

An auto-reset circuit according to a second aspect of the invention has the same structure except that the third terminal of the first active element is coupled to a control signal input terminal, instead of to the second power-supply terminal. The control signal enables the first active element to be turned off, thereby stopping current flow during tests.

An auto-reset circuit according to a third aspect of the invention has the same structure except that the third terminal of the first active element is coupled to the second terminal of the first active element. In addition, a resistor is inserted between the second terminal of the first active element and the third terminal of the second active element, and a capacitor is coupled between the third terminal of the second active element and the second power-supply terminal, to delay the release of the reset signal.

Features of the first, second, and third aspects of the invention can be combined in various ways and further features can be provided, including a diode to discharge the capacitor and a logic gate to control output of the reset signal during tests.

The invented circuit can be fabricated as a complimentary metal-oxide-semiconductor (CMOS) circuit in which the first and second active elements are MOSFETs and their first, second, and third terminals are their source, drain, and gate, respectively.

DETAILED DESCRIPTION OF THE INVENTION

Various embodiments of the invention will be described with reference to the attached drawings. These drawings illustrate the invention but do not restrict its scope, which should be determined solely from the appended claims.

It will be assumed that the auto-reset circuits described below are incorporated in an LSI or other device powered by two potentials, the higher of which is denoted $V_{DD}$ and the lower $V_{SS}$. The terms "high" and "low" will also be used to refer to these potentials. The term "supply voltage" will refer to the difference $V_{DD}-V_{SS}$.

The symbols $V_{TN}$ and $V_{TP}$ will be used to denote N-MOSFET and P-MOSFET threshold voltages, respectively, the threshold voltage of a MOSFET being the absolute gate-source voltage at which the MOSFET turns on. Typically, $V_{TN}$ and $V_{TP}$ are about 0.7 V. It will be assumed that during normal, steady-state operation the supply voltage $V_{DD}-V_{SS}$ exceeds the threshold voltages $V_{TN}$ and $V_{TP}$ sufficiently to enable the MOSFETs to turn on "hard;" that is, with negligible on-resistance.

1ST EMBODIMENT

Figure 1:
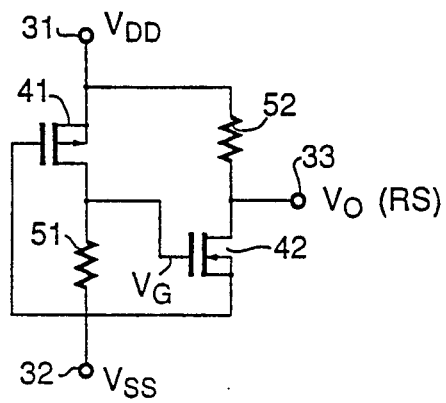
FIG. 1 is a circuit diagram of an auto-reset circuit illustrating a first embodiment of the invention.

FIG. 1 is a circuit diagram of an auto-reset circuit illustrating a first embodiment of the present invention. This auto-reset circuit has a first power-supply input terminal 31 to which $V_{DD}$ is applied, a second power-supply input terminal 32 to which $V_{SS}$ is applied, and an output terminal 33, the potential at which is denoted $V_O$. The reset signal RS is output at the output terminal 33.

The circuit comprises a first three-terminal active element 41, a second three-terminal active element 42, and two resistors 51 and 52. The first active element 41 is a P-MOSFET. The second active element 42 is an N-MOSFET. The circuit is thus a CMOS circuit.

P-MOSFET 41 and resistor 51 are coupled in series between the two power-supply terminals: the source of P-MOSFET 41 is coupled to the first power-supply terminal 31, the drain of P-MOSFET 41 is coupled to one terminal of resistor 51, and the other terminal of resistor 51 is coupled to the second power-supply terminal 32. The gate of P-MOSFET 41 is also coupled to the second power-supply terminal 32; this is a novel feature of the present invention. $V_{DD}$ is applied not only to the source of P-MOSFET 41 but also to the substrate or well in which P-MOSFET 41 is formed, as indicated by the conventional symbol in the drawing; that is, P-MOSFET 41 has no back-gate bias.

N-MOSFET 42 and resistor 42 are likewise coupled in series between the two power-supply terminals: one terminal of resistor 52 is coupled to the first power-supply terminal 31, the other terminal of resistor 52 is coupled to the drain of N-MOSFET 42, and the source of N-MOSFET 42 is coupled to the second power-supply terminal 32. The output terminal 33 is coupled to the drain of N-MOSFET 42. The gate of N-MOSFET 42 is coupled to the drain of P-MOSFET 41. The gate potential of N-MOSFET 42 is denoted by the symbol $V_G$. N-MOSFET 42 also has no back-gate bias; its source is at the same potential ($V_{SS}$) as the well or substrate in which it is formed.

The operation of the first embodiment will be explained with reference to FIG. 2. In this drawing the threshold voltages $V_{TP}$ of P-MOSFET 41 and $V_{TN}$ of N-MOSFET 41 are shown as slightly unequal: for example, $V_{TP}$ is 0.7 V and $V_{TN}$ 0.8 V. This is not a necessary condition; the invention is also applicable to circuits with equal threshold voltages.

In interval A before power-up, $V_{DD}$, $V_G$, and $V_O$ are all at the same potential as $V_{SS}$.

In interval B power is turned on and the supply voltage begins to rise at a rate determined by a time constant of the power supply. $V_{DD}$ is shown rising in relation to $V_{SS}$. The supply voltage $V_{DD}-V_{SS}$ is initially less than the threshold voltage $V_{TP}$ of P-MOSFET 41, so P-MOSFET 41 is off. N-MOSFET 42 is also off, because its gate is pulled down through resistor 51 to $V_{SS}$. The output terminal 33 is therefore pulled up through resistor 52 to $V_{DD}$, and the output voltage $V_O$ rises together with $V_{DD}$.

In interval C, the supply voltage $V_{DD}-V_{SS}$ exceeds $V_{TP}$ so P-MOSFET 41 turns on. P-MOSFET 41 and resistor 51 now act as a voltage divider between $V_{DD}$ and $V_{SS}$, and the gate potential $V_G$ of N-MOSFET 42 begins to rise. $V_G-V_{SS}$ is still less than the threshold voltage $V_{TN}$, however, so N-MOSFET 42 remains off and the output voltage $V_O$ continues to match $V_{DD}$.

In interval D, $V_G-V_{SS}$ passes $V_{TN}$ and N-MOSFET 42 turns on. N-MOSFET 42 and resistor 42 now act as a voltage divider between $V_{DD}$ and $V_{SS}$, but as the gate potential $V_G$ of N-MOSFET 42 continues to rise, the on-resistance of N-MOSFET 42 quickly decreases in comparison with the resistance of resistor 52, and the drain potential of N-MOSFET 42 approaches $V_{SS}$. The output voltage $V_O$ at output terminal 33 accordingly falls back toward $V_{SS}$. In the drawing, for clarity, $V_O$ is shown as falling to $V_{SS}$ instantaneously, but the fall actually takes place over a certain span of time within interval D.

In interval E, power-up is completed and $V_{DD}$ holds to its steady state. In this state the gate-source voltage of P-MOSFET 41 is $V_{DD}-V_{SS}$, so P-MOSFET 41 is turned on hard, the on-resistance of P-MOSFET 41 is negligible in comparison with the resistance of resistor 51, and $V_G$ is substantially equal to $V_{DD}$. The gate-source voltage $V_G-V_{SS}$ of N-MOSFET 42 is therefore substantially equal to $V_{DD}-V_{SS}$, N-MOSFET 42 is also turned on hard, the on-resistance of N-MOSFET 42 is negligible in comparison with the resistance of resistor 52, and the output voltage $V_O$ is substantially equal to $V_{SS}$.

The reset signal RS thus goes high ($V_O=V_{DD}$) during intervals B and C, then goes low ($V_O=V_{SS}$) in interval D and remains low in the steady state in interval E. RS is an active-high reset signal that can be used to initialize the internal circuits of an LSI or other device at power-up.

In both the circuit of FIG. 1 and the above-mentioned prior art, the reset signal RS is released when the supply voltage $V_{DD}-V_{SS}$ equals the threshold voltage $V_{TN}$ of N-MOSFET 42 plus the voltage drop across P-MOSFET 41. In the prior art circuit in which the drain and gate of P-MOSFET 41 were interconnected, this voltage drop was $V_{TP}$. In FIG. 1 the voltage drop can be made arbitrarily small by increasing the resistance value of resistor 51. If the resistance of resistor 51 is high enough that the voltage drop across P-MOSFET 41 is substantially nil, then the reset signal RS will release when the supply voltage $V_{DD}-V_{SS}$ equals the larger of $V_{TP}$ and $V_{TN}$. If $V_{TP}=0.7$ V and $V_{TN}=0.8$ V, the reset signal will release when $V_{DD}-V_{SS}=0.8$ V, for example. This assures that even a device powered at 3.0 V will come out of reset at power-up, and will do so even during tests performed at extreme temperatures with a reduced supply voltage.

2ND EMBODIMENT

Figure 3:
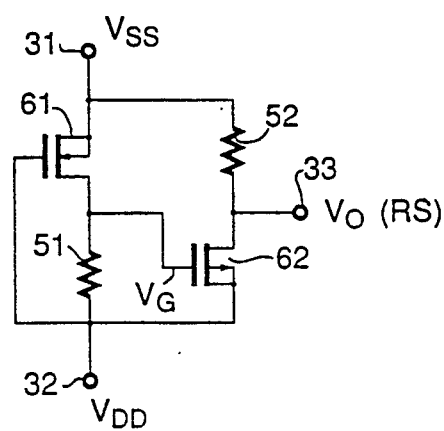
FIG. 3 is a circuit diagram of an auto-reset circuit illustrating a second embodiment of the invention.

FIG. 3 is a circuit diagram of an auto-reset circuit illustrating a second embodiment of the invention. Elements identical to elements of the first embodiment shown in FIG. 1 have the same reference numerals.

In this embodiment $V_{SS}$ is applied to the first power-supply terminal 31 and $V_{DD}$ is applied to the second power-supply terminal 32. The first active element is therefore an N-MOSFET 61 instead of the P-MOSFET 41 in FIG. 1, and the second active element is a P-MOSFET 62 instead of the N-MOSFET 42 in FIG. 1. Apart from these replacements, the active elements and resistors are interconnected in the same manner as in FIG. 1.

Figure 4:
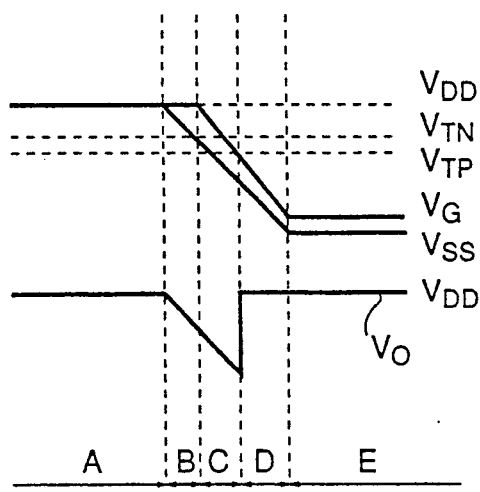
FIG. 4 is a voltage waveform diagram illustrating the operation of FIG. 3.

FIG. 4 is a voltage waveform diagram illustrating the operation of the second embodiment. In this drawing, when power is turned on $V_{DD}$ is shown as remaining constant while $V_{SS}$ decreases. This may appear different from FIG. 2, but in fact the two drawings show the same power-up event. $V_{DD}$ and $V_{SS}$ do not have independent absolute values; only the difference between them is meaningful. $V_G$ now denotes the gate potential of P-MOSFET 62. $V_G$ and $V_O$ are shown in relation to $V_{DD}$.

Figure 2:
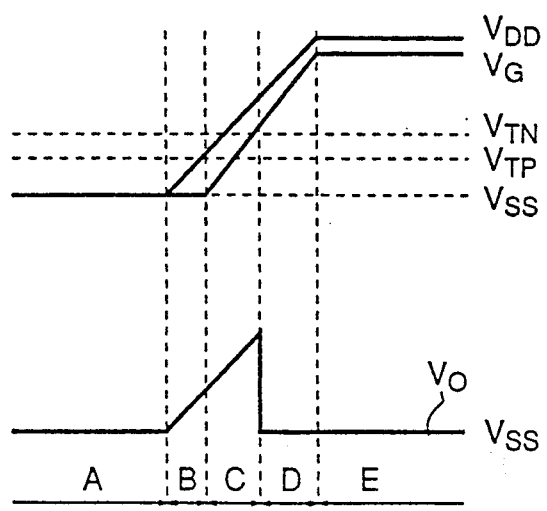
FIG. 2 is a voltage waveform diagram illustrating the operation of FIG. 1.

The operation of the second embodiment as illustrated in FIG. 4 is the same as the operation of the first embodiment illustrated in FIG. 2, except that the roles of $V_{DD}$ and $V_{SS}$ are reversed. In interval A, $V_{SS}$, $V_G$, and $V_O$ are all equal to $V_{DD}$. As $V_{SS}$ decreases in intervals B and C the gate-source voltage $|V_G-V_{DD}|$ remains less than the threshold voltage $V_{TP}$ of P-MOSFET 62, so P-MOSFET 62 stays off, and the output voltage $V_O$ decreases together with $V_{SS}$. In interval D, $|V_G-V_{DD}|$ exceeds $V_{TP}$ and P-MOSFET 62 turns on, causing the output voltage $V_O$ to return to the $V_{DD}$ level. In interval E the supply voltage $V_{DD}-V_{SS}$ is in its steady state and the output voltage $V_O$ remains at $V_{DD}$.

The reset signal in this second embodiment is active low: it normally stays at the high level ($V_{DD}$), but goes low ($V_{SS}$) for an interval during power-up. The choice between the first and second embodiments depends on whether an active-high or an active-low reset signal is more convenient.

3RD EMBODIMENT

Figure 5:
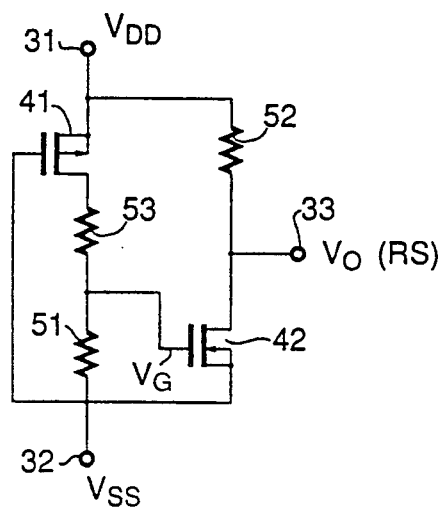
FIG. 5 is a circuit diagram of an auto-reset circuit illustrating a third embodiment of the invention.

FIG. 5 is a circuit diagram of an auto-reset circuit illustrating a third embodiment of the invention. Elements identical to elements of the first embodiment shown in FIG. 1 have the same reference numerals.

The difference between this third embodiment and the first is that an additional resistor 53 has been inserted in series between resistor 51 and the drain of P-MOSFET 41. The gate of N-MOSFET 42 is coupled to a point between resistors 51 and 53.

Figure 6:
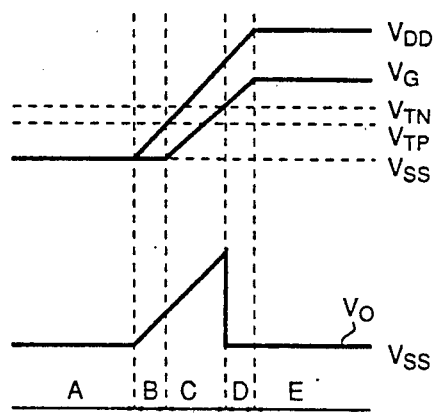
FIG. 6 is a voltage waveform diagram illustrating the operation of FIG. 5.

Referring to FIG. 6, this embodiment operates like the first embodiment except that the gate potential $V_G$ of N-MOSFET 42 is now divided by the resistance ratio of resistors 51 and 53, so $V_G$ rises at a more moderate rate than $V_{DD}$. Since it takes $V_G$ longer to reach the threshold voltage $V_{TN}$ of N-MOSFET 42, interval C is longer than in FIG. 2, and when $V_G$ does reach $V_{TN}$, the $V_{DD}$ potential is higher than in FIG. 2. The potential $V_O$ of the reset signal RS therefore follows $V_{DD}$ to a higher level before dropping back to $V_{SS}$.

The supply-voltage value at which N-MOSFET 42 turns on and reset signal RS is released can be adjusted by altering the resistance ratio of resistors 51 and 53. If resistors 51 and 53 have substantially equal resistance values (both 500 kilohms, for example) and the on-resistance of P-MOSFET 41 is negligible in comparison, then RS will release at about 1.6 V instead of the 0.8 V mentioned in the first embodiment. The release voltage can be increased by increasing the value of resistor 53 in relation to resistor 51, or decreased by decreasing the value of resistor 53 in relation to resistor 51, as required by the application.

4TH EMBODIMENT

Figure 7:
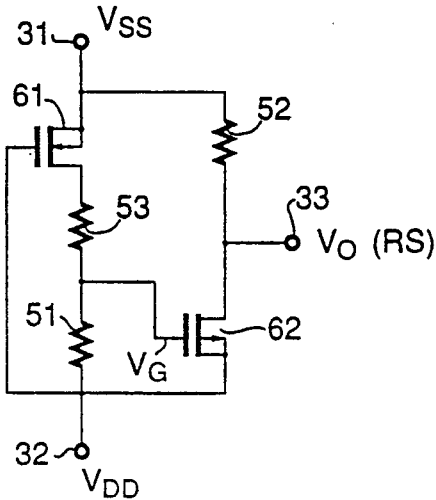
FIG. 7 is a circuit diagram of an auto-reset circuit illustrating a fourth embodiment of the invention.

FIG. 7 is a circuit diagram of an auto-reset circuit illustrating a fourth embodiment of the invention. Elements identical to elements of the second embodiment shown in FIG. 3 have the same reference numerals.

This fourth embodiment is related to the second embodiment in the same way that the third embodiment was related to the first. Specifically, an additional resistor 53 is inserted in series between resistor 51 and the drain of N-MOSFET 61, and the gate of P-MOSFET 62 is coupled to a point between resistors 51 and 53.

Figure 8:
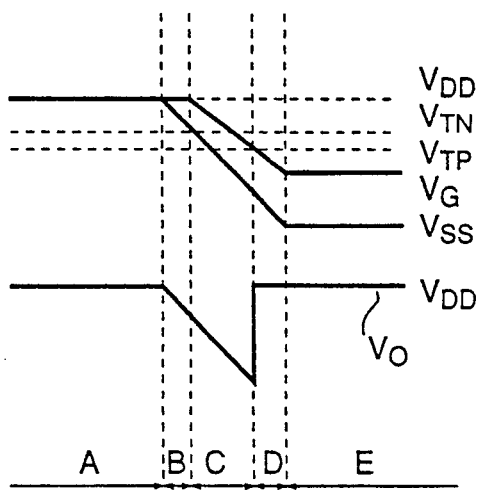
FIG. 8 is a voltage waveform diagram illustrating the operation of FIG. 7.

Referring to FIG. 8, this embodiment operates like the second embodiment except that the gate potential $V_G$ of P-MOSFET 62, being divided by resistors 51 and 53, falls at a more moderate rate. As a result, interval C is longer than in FIG. 4, and the reset signal RS follows $V_{SS}$ down to a lower level before returning to the $V_{DD}$ level.

As in the third embodiment, the supply-voltage value at which the reset signal RS is released can be adjusted by altering the resistance ratio of resistors 51 and 53. Increasing the resistance of resistor 53 in relation to resistor 51 makes RS release at a higher supply voltage value (a lower $V_{SS}$ level in FIG. 8). Decreasing the resistance of resistor 53 in relation to resistor 51 makes RS release at a lower supply voltage value (a higher $V_{SS}$ level in FIG. 8).

The first four embodiments solve the problem of failure of the reset signal to release, and the third and fourth embodiments enable the release point to be set at any desired level between the higher of the two transistor threshold voltages $V_{TP}$ and $V_{TN}$ and the steady-state supply voltage. These embodiments do not, however, solve the other problems referred to in the prior art. If the power supply rises quickly (in a matter of microseconds or less, for example) the reset signal RS may have inadequate duration, or may not be output at all. Modifications of the above embodiments to solve this problem will be described in the next four embodiments.

5TH EMBODIMENT

Figure 9:
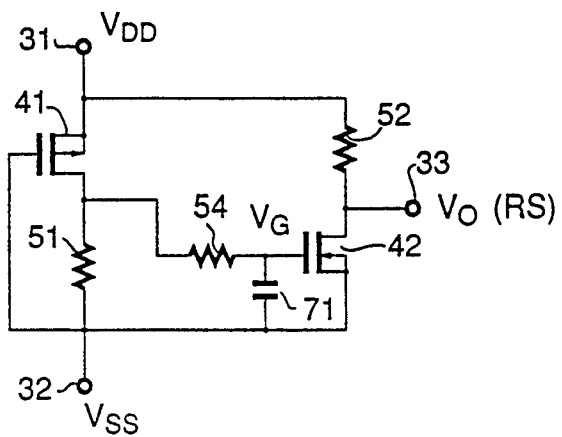
FIG. 9 is a circuit diagram of an auto-reset circuit illustrating a fifth embodiment of the invention.

FIG. 9 is a circuit diagram of an auto-reset circuit illustrating a fifth embodiment of the invention. Elements identical to elements of the first embodiment shown in FIG. 1 have the same reference numerals.

In this auto-reset circuit a third resistor 54 is inserted in series between the gate of N-MOSFET 42 (the second active element) and the drain of P-MOSFET 41 (the first active element). The gate of N-MOSFET 42 is furthermore coupled through a capacitor 71 to the second power-supply terminal 32. The capacitor 71 is connected to a point between the gate of N-MOSFET 42 and resistor 54. $V_G$ is now not only the gate potential of N-MOSFET 42 but also the potential to which capacitor 71 is charged in relation to $V_{SS}$.

The operation of this auto-reset circuit will be explained with reference to FIGS. 10 and 11.

Figure 10:
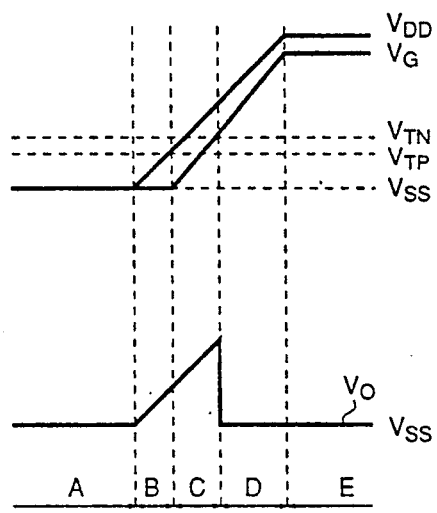
FIG. 10 is a voltage waveform diagram illustrating the operation of FIG. 9.

FIG. 10 is a voltage waveform diagram illustrating the case in which $V_{DD}$ rises slowly in comparison to the time constant of resistor 54 and capacitor 71. As it rises in interval C, $V_{DD}$ charges capacitor 71 through resistor 54; that is, $V_{DD}$ is integrated by resistor 54 and capacitor 71 to produce the gate potential $V_G$. Since $V_{DD}$ rises slowly, however, integration is able to keep pace, and $V_G$ has substantially the same waveform as in FIG. 2. The reset signal RS also has substantially the same waveform ($V_O$) as in FIG. 2.

Figure 11:
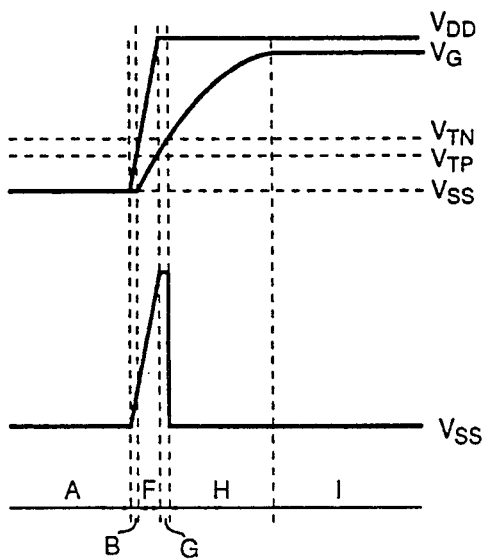
FIG. 11 is another voltage waveform diagram illustrating the operation of FIG. 9.

FIG. 11 is a voltage waveform diagram illustrating the case in which $V_{DD}$ rises quickly in comparison to the time constant of resistor 54 and capacitor 71. FIG. 11 would apply, for example, if resistor 54 has a resistance of 500 kilohms, capacitor 71 has a capacitance of about 12 picofarads (making the time constant 6 microseconds), and $V_{DD}$ rises in about 1 microsecond.

In interval A in FIG. 11, before power-up $V_{DD}$, $V_G$, and $V_O$ are all at the same potential as $V_{SS}$. When power is turned on, there is a very brief interval B during which $V_{DD}$ is less than the threshold voltage $V_{TP}$ of P-MOSFET 41, and both P-MOSFET 41 and N-MOSFET 42 are off. In interval B the reset output voltage $V_O$ begins to rise together with $V_{DD}$, as in FIG. 10.

In interval F $V_{DD}$ rises all the way to the steady state, quickly passing both transistor threshold levels $V_{TP}$ and $V_{TN}$. P-MOSFET therefore 41 turns on and $V_{DD}$ begins to charge capacitor 71 through resistor 54. The gate potential $V_G$ has the waveform of $V_{DD}$ integrated by resistor 54 and capacitor 72. Because of the time constant of resistor 54 and capacitor 72, the rise of $V_G$ takes place at a comparatively moderate rate over intervals F, G, and H.

In intervals F and G in FIG. 11, $V_G-V_{SS}$ remains less than the threshold voltage $V_{TN}$, so N-MOSFET 42 remains off and the output voltage $V_O$ continues to follow $V_{DD}$. In interval H, when $V_G - V_{SS}$ passes $V_{TN}$, N-MOSFET 42 turns on and the output voltage $V_O$ falls back to the $V_{SS}$ level. Interval I shows the steady state, in which $V_G$ is at substantially the same potential as $V_{DD}$, N-MOSFET 42 is turned on hard, and $V_O$ is held reliably at the $V_{SS}$ level.

Calculations made under the assumptions that $V_{TN}$ is 0.7 V, $V_{DD}$ rises from 0 V to 5 V in 1 microsecond, and the reset signal RS must drive a certain capacitive load show that, without resistor 54 and capacitor 71 to slow the rise of the gate potential $V_G$, the reset signal RS would have a pulse width of only about 17 nanoseconds. With resistor 54 and capacitor 71, assuming the above-mentioned values of 500 kilohms for resistor 54 and 12 picofarads for capacitor 71, the pulse width becomes approximately 1.1 microseconds, making the reset much more dependable. If this pulse width is still inadequate it can be increased by increasing the resistance of resistor 54 or the capacitance of capacitor 71, or both. Accordingly, the fifth embodiment enables a reliable power-up reset to be carried out even with a fast-rising power supply.

6TH EMBODIMENT

Figure 12:
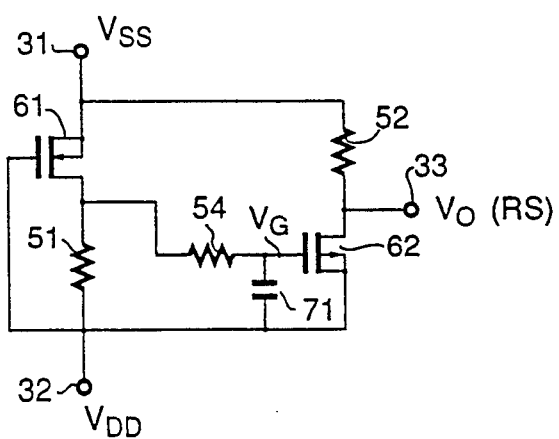
FIG. 12 is a circuit diagram of an auto-reset circuit illustrating a sixth embodiment of the invention.

FIG. 12 is a circuit diagram of an auto-reset circuit illustrating a sixth embodiment of the invention. Elements identical to elements of the fifth embodiment shown in FIG. 9 have the same reference numerals.

The sixth embodiment has the same circuit topology as the fifth embodiment, but $V_{SS}$ is applied to the first power-supply terminal 31, $V_{DD}$ is applied to the second power-supply terminal 32, the first active element is an N-MOSFET 61, and the second active element is a P-MOSFET 62. The operation of the sixth embodiment will be explained briefly with reference to FIGS. 13 and 14.

Figure 13:
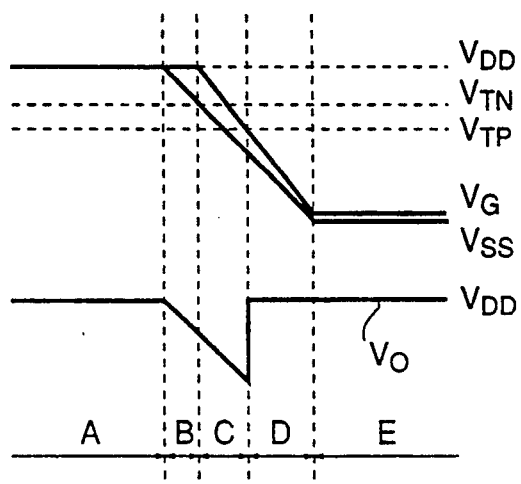
FIG. 13 is a voltage waveform diagram illustrating the operation of FIG. 12.

FIG. 13 is a voltage waveform diagram illustrating the case in which the fall of $V_{SS}$ (that is, the rise of $V_{DD}$) is slow in relation to the time constant of resistor 54 and capacitor 71. Since capacitor 71 has adequate time to charge during the fall of $V_{SS}$, the waveforms in FIG. 13 are substantially the same as those of the second embodiment in FIG. 4.

Figure 14:
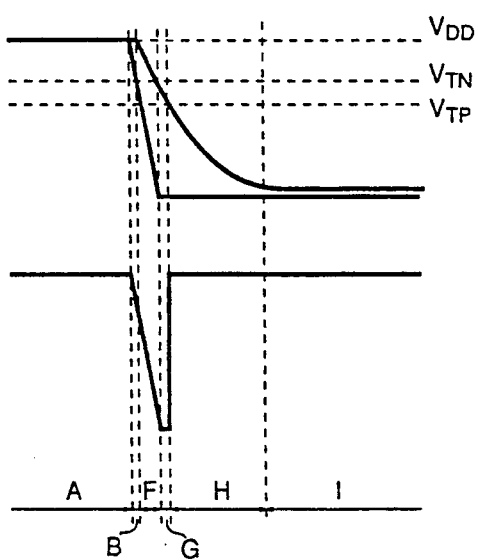
FIG. 14 is another voltage waveform diagram illustrating the operation of FIG. 12.

FIG. 14 is a voltage waveform diagram illustrating the case in which the fall of $V_{SS}$ is quick in relation to the time constant of resistor 54 and capacitor 71. The waveforms in FIG. 14 are identical to those in FIG. 11 with the roles of $V_{DD}$ and $V_{SS}$ and the positive and negative senses of the waveforms reversed. Due to the presence of resistor 54 and capacitor 71, an active-low reset pulse with an adequate pulse width is obtained despite the rapid transition of the supply voltage from zero volts to its steady state.

The sixth embodiment provides the same effects as the fifth embodiment, except that the reset signal RS is active low.

7TH EMBODIMENT

Figure 15:
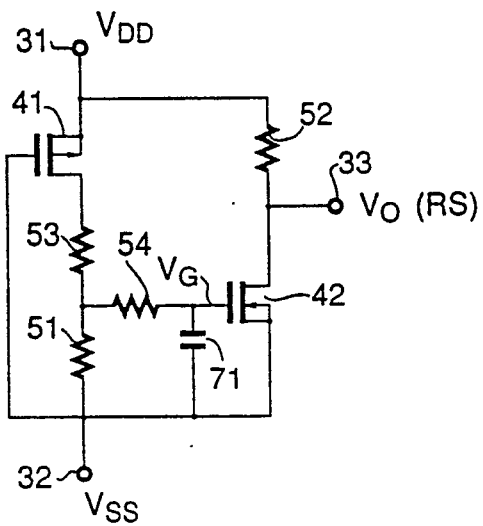
FIG. 15 is a circuit diagram of an auto-reset circuit illustrating a seventh embodiment of the invention.

FIG. 15 is a circuit diagram of an auto-reset circuit illustrating a seventh embodiment of the invention. Elements identical to elements of the fifth embodiment shown in FIG. 9 have the same reference numerals.

The difference between this embodiment and the fifth is the presence of another resistor 53 inserted in series between resistor 51 and the drain of P-MOSFET 41, as in the third embodiment. Resistor 54 is coupled to a point between resistors 51 and 53.

The operation of the seventh embodiment will be explained briefly with reference to FIGS. 16 and 17.

Figure 16:
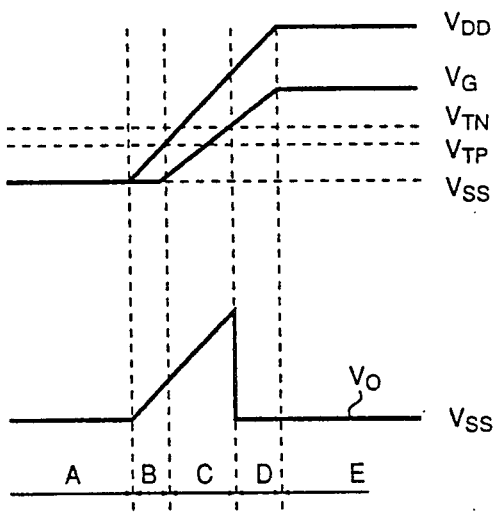
FIG. 16 is a voltage waveform diagram illustrating the operation of FIG. 15.

FIG. 16 is a voltage waveform diagram illustrating the operation of the seventh embodiment when the rise of $V_{DD}$ is slow in relation to the time constant of resistors 53 and 54 and capacitor 71. Since capacitor 71 has ample time to charge during the rise of $V_{DD}$, the waveforms are substantially the same as in FIG. 6, which illustrated the third embodiment. $V_G$ rises somewhat more slowly, however, because the gate capacitance of N-MOSFET 42 must be charged through both resistor 53 and resistor 54. Consequently, the reset signal RS attains a higher potential $V_O$ than in FIG. 6.

Figure 17:
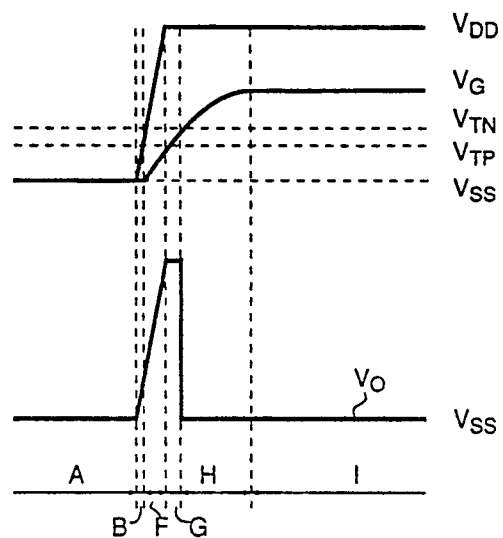
FIG. 17 is another voltage waveform diagram illustrating the operation of FIG. 15.

FIG. 17 is a voltage waveform diagram illustrating the operation of the seventh embodiment when $V_{DD}$ rises quickly in relation to the time constant of resistors 53 and 54 and capacitor 71. The waveforms are similar to those of the fifth embodiment in FIG. 11, except that $V_G$ rises even more slowly, since capacitor 71 must be charged through both resistors 53 and 54 instead of just resistor 54. The pulse width of the reset signal is therefore even greater than in FIG. 11.

The seventh embodiment combines the advantages of the third and fifth embodiments: when $V_{DD}$ rises slowly, the $V_{DD}$ level at which the reset signal RS is released can be adjusted by adjusting the resistance ratio of resistors 51 and 53; and when $V_{DD}$ rises fast, an adequate reset pulse width can be obtained by suitable selection of the values of resistors 51 and 53 and capacitor 71.

8TH EMBODIMENT

Figure 18:
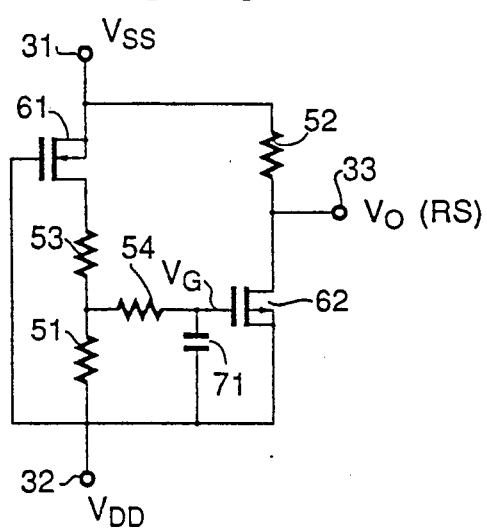
FIG. 18 is a circuit diagram of an auto-reset circuit illustrating a eighth embodiment of the invention.

FIG. 18 is a circuit diagram of an auto-reset circuit illustrating an eighth embodiment of the invention. Elements identical to elements of the sixth embodiment shown in FIG. 12 have the same reference numerals.

The eighth embodiment is related to the sixth in the same way that the seventh was related to the fifth, by the addition of a resistor 53 coupled in series between resistor 51 and the first active element, which in the sixth and eighth embodiments is the N-MOSFET 61. The operation of the eighth embodiment will be explained briefly with reference to FIGS. 19 and 20.

Figure 19:
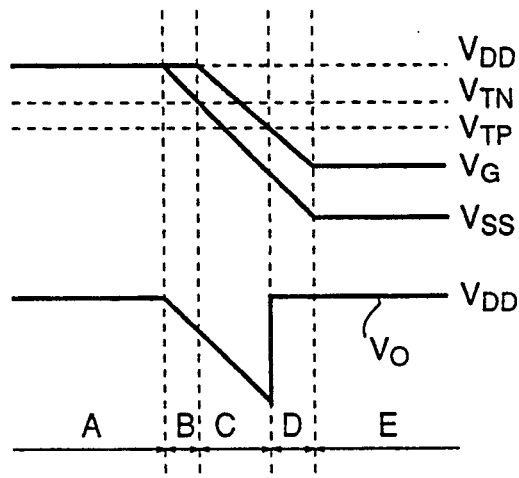
FIG. 19 is a voltage waveform diagram illustrating the operation of FIG. 18.
Figure 20:
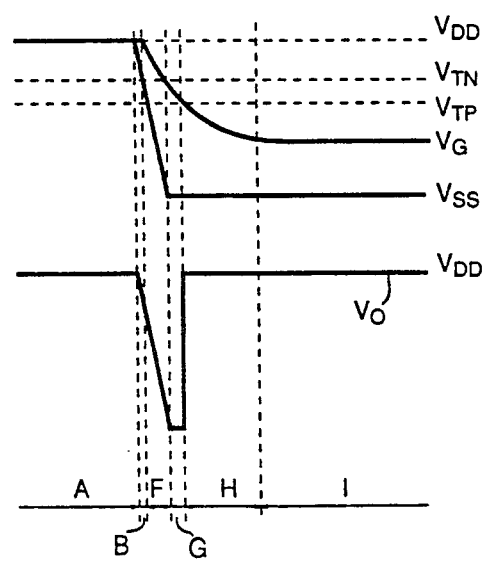
FIG. 20 is another voltage waveform diagram illustrating the operation of FIG. 18.

FIG. 19 is a voltage waveform diagram illustrating the case in which the fall of $V_{SS}$ (that is, the rise of $V_{DD}$) is slow in relation to the time constant of resistors 53 and 54 and capacitor 71. FIG. 20 is a voltage waveform diagram illustrating the case in which $V_{SS}$ falls quickly in relation to this time constant. These two diagrams are identical to FIGS. 16 and 17 with the roles of $V_{DD}$ and $V_{SS}$ and the positive and negative senses of the waveforms reversed. The eighth embodiment provides the same effects as the seventh, except that the reset signal RS is active low.

The fifth through eighth embodiments solve the reset problem presented by a fast-rising power supply at power-up. They do not, however, solve the problem of a momentary power interruption followed by a quick recovery. Indeed, if the interruption is sufficiently short and the recovery sufficiently quick, no reset signal will be output at all, because capacitor 71 will not have time to discharge and the second active element (N-MOSFET 42 or P-MOSFET 62) will remain on.

Circuits that can output a reset signal RS even after momentary power interruptions (lasting only a few microseconds, for example) will be described below.

9TH EMBODIMENT

Figure 21:
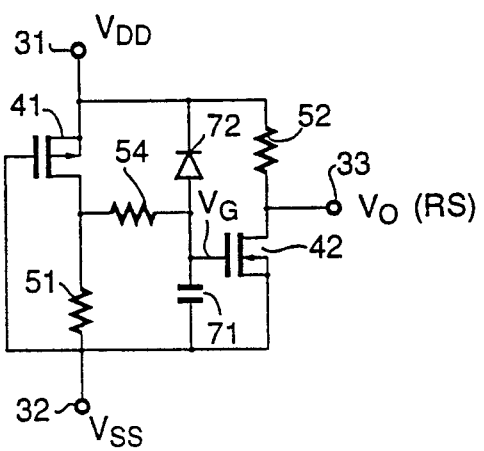
FIG. 21 is a circuit diagram of an auto-reset circuit illustrating a ninth embodiment of the invention.

FIG. 21 is a circuit diagram of an auto-reset circuit illustrating a ninth embodiment of the invention. Elements identical to elements of the fifth embodiment shown in FIG. 9 have the same reference numerals.

This embodiment has been obtained from the fifth embodiment by coupling the gate of N-MOSFET 42 (the second active element) to the first power-supply terminal 31 through a diode 72. The anode of diode 72 is connected to a point between the gate of N-MOSFET 42 and resistor 54. The cathode of diode 72 is connected to a point between resistor 52 and the first power-supply terminal 31. $V_G$ is now not only the gate potential of N-MOSFET 42 and the potential of the charge in capacitor 72, but also the anode potential of diode 72.

The operation of the ninth embodiment will be explained with reference to FIGS. 22 and 23.

Figure 22:
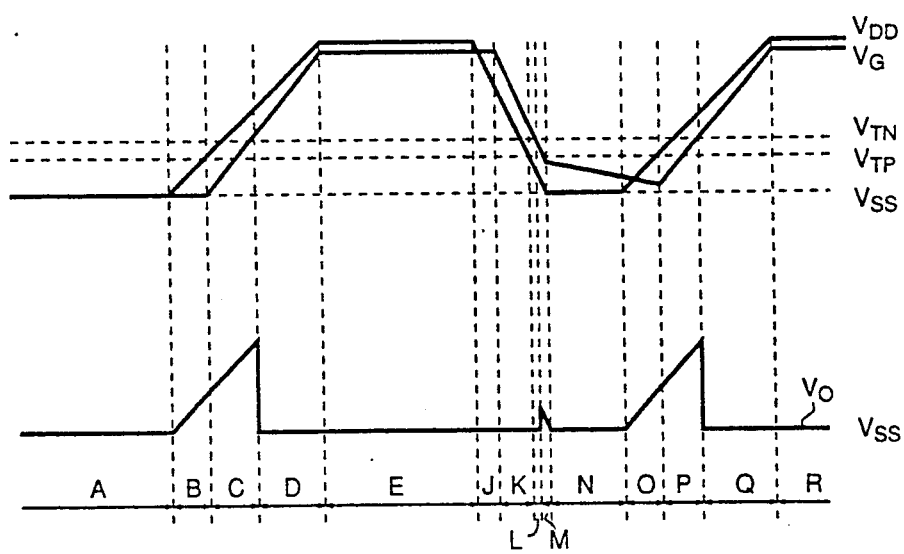
FIG. 22 is a voltage waveform diagram illustrating the operation of FIG. 21.

FIG. 22 is a voltage waveform diagram illustrating the operation when $V_{DD}$ rises slowly at power-up, later drops due to a momentary power interruption, then rises slowly again, "slowly" meaning slowly in relation to the time constant of resistor 54 and capacitor 71.

During power-up and in the steady state, the cathode potential ($V_{DD}$) of diode 72 is equal to or higher than the anode potential ($V_G$), so diode 72 does not conduct. During intervals A to E, the operation depicted in FIG. 22 is substantially identical to the operation of the fifth embodiment depicted in FIG. 10, as if diode 72 were not present.

When the power supply is interrupted and $V_{DD}$ begins to drop in interval J, the drain potential of P-MOSFET 41 also begins to drop, permitting capacitor 71 to discharge through resistor 54. The discharge is slow, however, because the discharge current equals the small potential difference between $V_G$ and the drain potential of P-MOSFET 41 divided by the resistance of resistor 54. Although $V_G$ decreases slightly due to this discharge, the decrease is not noticeable in the drawing.

In interval K, however, $V_{DD}$ has fallen far enough that the difference between $V_G$ and $V_{DD}$ equals or exceeds the forward voltage (0.7 V, for example) necessary to make diode 72 conduct. Diode 72 now offers little resistance, and capacitor 71 begins to discharge rapidly through diode 72 to the first power supply terminal 31. $V_G$ begins to drop sharply, paralleling the drop of $V_{DD}$.

In interval L, $V_{DD}$ falls below the threshold voltage $V_{TP}$ of P-MOSFET 41, which turns off, but capacitor 71 continues discharging through diode 72.

In interval M, $V_G - V_{SS}$ falls below the threshold voltage $V_{TN}$ of N-MOSFET 42 and N-MOSFET 42 turns off. The reset output voltage $V_O$ therefore rises to $V_{DD}$, but since $V_{DD}$ is by now approaching $V_{SS}$, the resulting reset pulse is small and of brief duration. At the end of interval M $V_{DD}$ has fallen all the way to $V_{SS}$, so $V_O$ also returns to $V_{SS}$.

In interval N, $V_{DD}$ remains at $V_{SS}$ and $V_G$ falls below the threshold voltage of diode 72. The forward voltage across diode 72 is now insufficient for substantial conduction to take place. Capacitor 71 continues to discharge, at a slower rate, through resistors 54 and 51 to the second power supply terminal 32. If resistors 51 and 54 have resistances of 500 kilohms and capacitor 71 has a capacitance of 3 picofarads, then in about 3.8 microseconds during this interval $V_G$ decreases from 0.7 V to 0.2 V, at which level N-MOSFET 42 is turned off hard.

In interval O, the power supply starts to recover and $V_{DD}$ rises again, at the same rate as at power-up. MOSFETS 41 and 42 and diode 72 stay turned off in this interval, so the output voltage $V_O$ rises together with $V_{DD}$, while capacitor 71 continues to discharge through resistors 54 and 51. As $V_{DD}$ rises and $V_G$ falls, diode 72 becomes reverse-biased again.

In interval P, $V_{DD}$ exceeds the threshold voltage $V_{TP}$ of P-MOSFET 41, so P-MOSFET 41 turns on, capacitor 71 begins to charge again, and $V_G$ now rises. $V_G - V_{SS}$ is still less than the threshold voltage $V_{TN}$ of N-MOSFET 42, so N-MOSFET 42 remains off and the output voltage $V_O$ continues to rise together with $V_{DD}$.

In interval Q, $V_G - V_{SS}$ exceeds $V_{TN}$, so N-MOSFET 42 turns on and the reset output voltage $V_O$ drops back to the $V_{SS}$ level. In interval R the steady state is restored, N-MOSFET 42 is turned on hard, and $V_O$ is held at the $V_{SS}$ level.

By permitting capacitor 71 to discharge quickly in intervals K, L, and M, diode 72 allows N-MOSFET 42 to turn off even during a relatively brief power interruption, so that a reset signal can be output when power is recovered. The voltage waveform ($V_O$) of the reset signal during recovery from the power interruption in intervals O and P is substantially the same as the waveform in intervals B and C at power-up.

Figure 23:
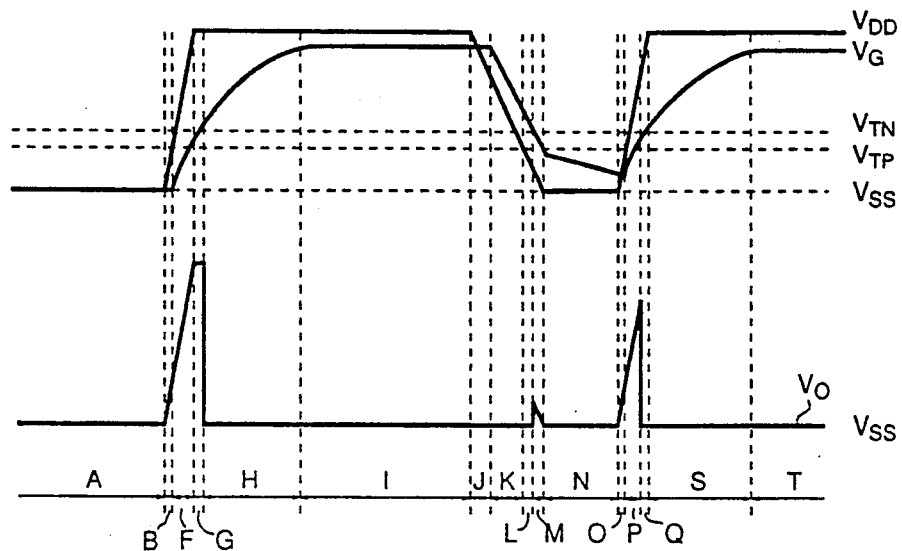
FIG. 23 is another voltage waveform diagram illustrating the operation of FIG. 21.

FIG. 23 shows the case in which the supply voltage rises quickly in relation to the time constant of resistor 54 and capacitor 71, both at power-up and in recovering from a momentary power interruption. The waveforms in intervals A, B, F, G, H, and I at power-up are the same as the waveforms of the fifth embodiment, illustrated in FIG. 11. The waveforms in intervals J, K, L, M, and N, during which $V_{DD}$ drops momentarily to $V_{SS}$, are the same as in FIG. 22.

The waveforms during recovery from the power interruption in intervals O, P, Q, S, and T are generally similar to the waveforms in intervals B, F, G, H, and I at power-up. The main difference is that, since $V_G$ starts rising from a value slightly higher than $V_{SS}$, it reaches the threshold voltage $V_{TN}$ of N-MOSFET 42 at the beginning of interval Q instead of the end, so the reset pulse is shorter by the width of interval Q than at power-up. The reduction in pulse width is comparatively slight, however. As in the fifth embodiment, resistor 54 and capacitor 71 permit an adequate reset pulse to be output even when the power supply rises quickly, and as in FIG. 22, by discharging capacitor 71 and turning off N-MOSFET 42 quickly, diode 72 enables a reset signal to be output after even a momentary power interruption. With the circuit constants cited above, a dependable reset is obtained when interval N in FIG. 23 is as short as 3.8 microseconds.

10TH EMBODIMENT

Figure 24:
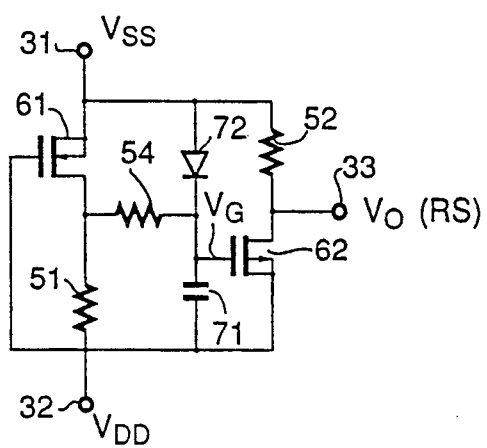
FIG. 24 is a circuit diagram of an auto-reset circuit illustrating a tenth embodiment of the invention.

FIG. 24 is a circuit diagram of an auto-reset circuit illustrating a tenth embodiment of the invention. Elements identical to elements of the ninth embodiment shown in FIG. 21 have the same reference numerals.

This embodiment has the same circuit topology as the ninth, but the first active element is an N-MOSFET 61, the second active element is a P-MOSFET 41, $V_{SS}$ is applied to the first power-supply terminal 31, and $V_{DD}$ is applied to the second power-supply terminal 32. Diode 72 is accordingly connected in the reverse direction: its anode is coupled to the first power-supply terminal 31, and its cathode to the gate of P-MOSFET 62.

Figure 25:
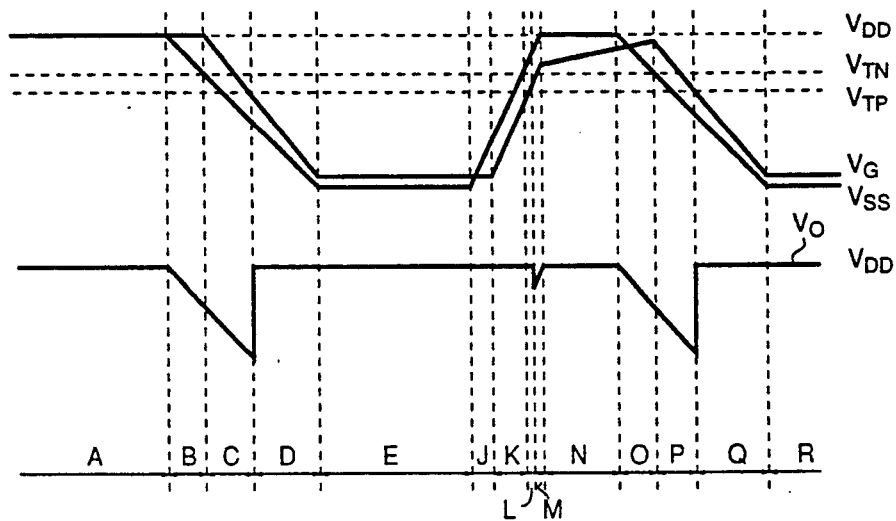
FIG. 25 is a voltage waveform diagram illustrating the operation of FIG. 24.
Figure 26:
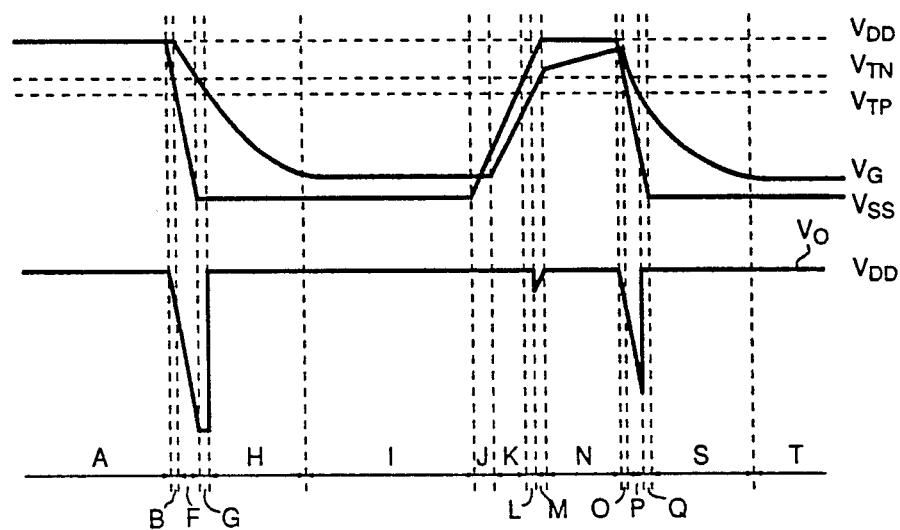
FIG. 26 is another voltage waveform diagram illustrating the operation of FIG. 24.

The operation of the tenth embodiment is illustrated in FIG. 25 for the case of a slow-rising power supply, and in FIG. 26 for the case of a fast-rising power supply, the rise of the power supply being depicted in both cases as a fall of $V_{SS}$. The waveforms are the same as in FIGS. 22 and 23, with positive and negative reversed. A detailed description will be omitted, since the operation of the tenth embodiment is exactly analogous to the operation of the ninth. The tenth embodiment provides the same effects for an active-low reset signal as the ninth embodiment provides for an active-high reset signal.

11TH EMBODIMENT

Figure 27:
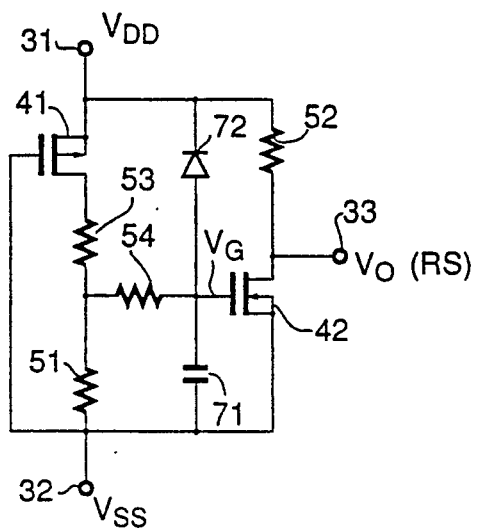
FIG. 27 is a circuit diagram of an auto-reset circuit illustrating a eleventh embodiment of the invention.

FIG. 27 is a circuit diagram of an auto-reset circuit illustrating an eleventh embodiment of the invention. Elements identical to elements of the ninth embodiment shown in FIG. 21 have the same reference numerals.

In this embodiment, a resistor 53 is coupled between the drain of P-MOSFET 41 and the point of interconnection of resistors 51 and 54, as in the seventh embodiment, and a diode 72 is coupled between the gate of N-MOSFET 42 and the first power-supply terminal 31, as in the ninth embodiment.

Figure 28:
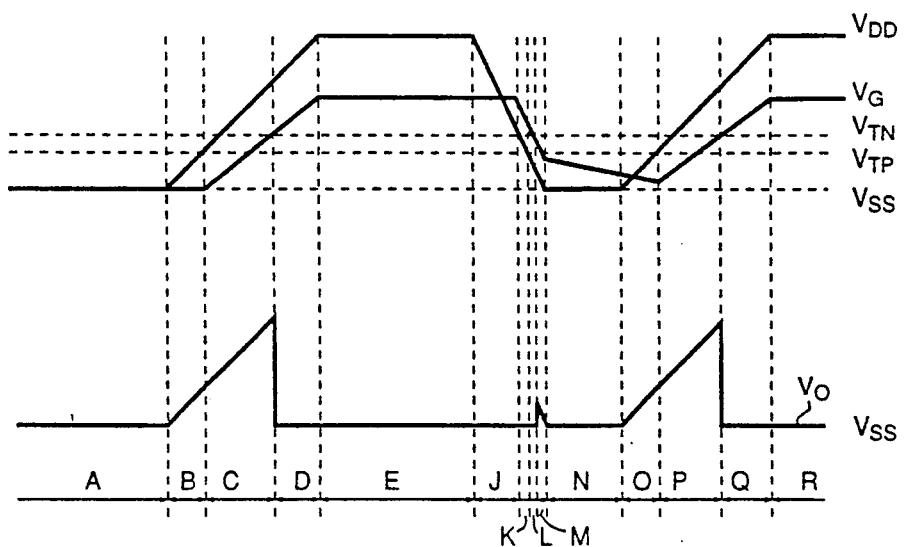
FIG. 28 is a voltage waveform diagram illustrating the operation of FIG. 27.

FIG. 28 is a voltage waveform diagram illustrating the operation of the eleventh embodiment when $V_{DD}$ rises rapidly in relation to the time constant of resistors 53 and 54 and capacitor 71. The waveforms in intervals A through E at power-up are substantially the same as the corresponding waveforms of the seventh embodiment, as illustrated in FIG. 16. The waveforms during the momentary power interruption and its recovery in intervals J through R are generally similar to the corresponding waveforms of the ninth embodiment, as illustrated in FIG. 22, but since $V_G$ has a lower steady-state value, interval J, during which diode 72 is non-conducting, is longer and interval K, during which diode 72 conducts and MOSFETS 41 and 42 are both still on, is shorter.

Although capacitor 71 has less time to discharge through diode 72 during intervals K, L, and M than in FIG. 22, the discharge starts from a lower steady-state $V_G$ potential, so $V_G$ arrives at approximately the same value at the end of interval M in both FIGS. 28 and 22, and falls to about the same value in intervals N and O. This value is low enough to turn off N-MOSFET 42 and create a reset signal in intervals O and P that is substantially the same as the one in intervals B and C at power-up.

Figure 29:
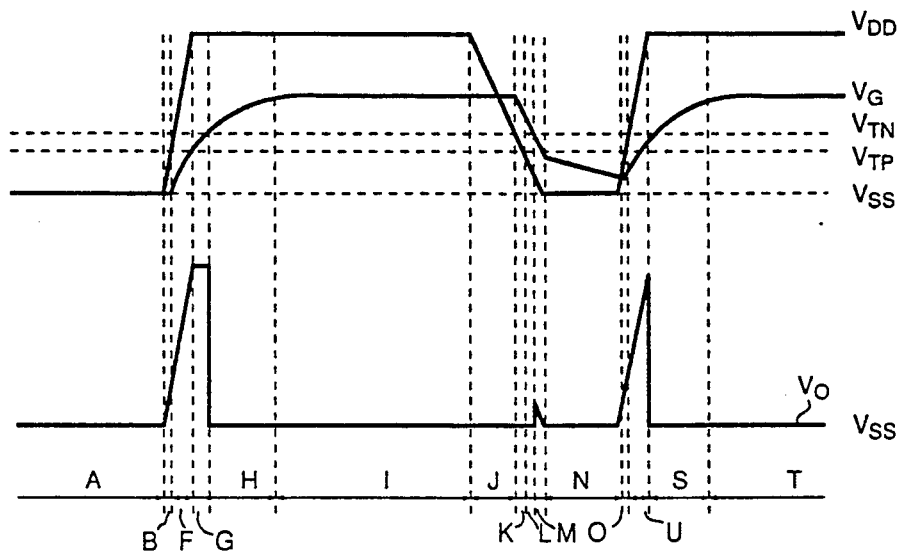
FIG. 29 is another voltage waveform diagram illustrating the operation of FIG. 27.

FIG. 29 illustrates the operation of the eleventh embodiment when $V_{DD}$ rises quickly in relation the time constant of resistors 53 and 54 and capacitor 71. The waveforms are similar to those of the ninth embodiment in FIG. 23, except that the steady-state $V_G$ potential is lower, as in the seventh embodiment. During the recovery from the momentary power interruption, $V_{DD}$ rises from the $V_{SS}$ level to the steady state during intervals O and U, and $V_G$ rises from a value slightly higher than $V_{SS}$ to the threshold value $V_{TN}$ of N-MOSFET 42 in interval U. A reset signal is therefore output during intervals O and U.

The eleventh embodiment combines the effects of the seventh and ninth embodiments: the release level of the reset signal can be altered by changing the resistance ratio of resistors 51 and 53; owing to resistor 54 and capacitor 71, a reset signal is output even if the power supply rises quickly; and due to diode 72, capacitor 71 can discharge quickly during a momentary power interruption, so that a reset signal can be output again when power is recovered.

12TH EMBODIMENT

Figure 30:
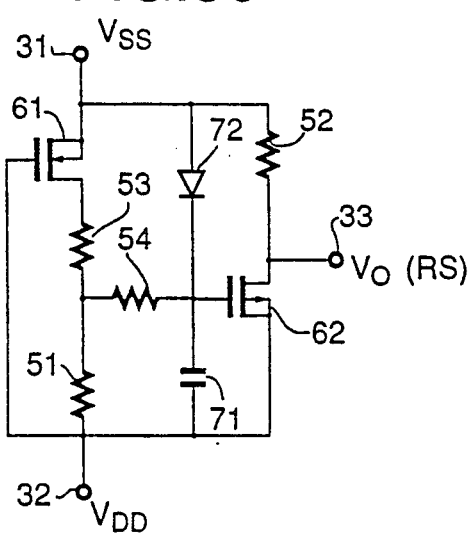
FIG. 30 is a circuit diagram of an auto-reset circuit illustrating a twelfth embodiment of the invention.

FIG. 30 is a circuit diagram of an auto-reset circuit illustrating a twelfth embodiment of the invention. Elements identical to elements of the tenth and eleventh embodiments shown in FIGS. 24 and 27 have the same reference numerals.

This embodiment has the same circuit topology as the eleventh, but the first active element is an N-MOSFET 61, the second active element is a P-MOSFET 41, $V_{SS}$ is applied to the first power-supply terminal 31, and $V_{DD}$ is applied to the second power-supply terminal 32. Diode 72 is connected so that its anode is coupled to the first power-supply terminal 31 and its cathode to the gate of P-MOSFET 62.

Figure 31:
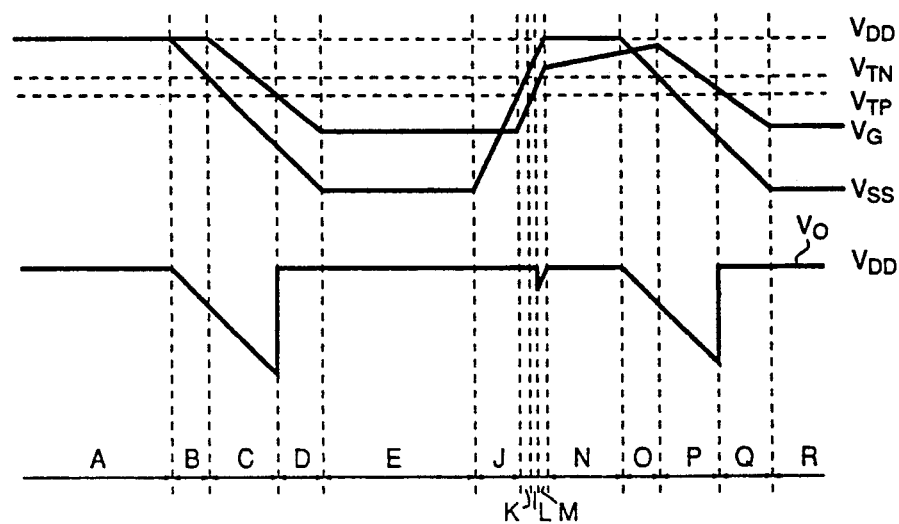
FIG. 31 is a voltage waveform diagram illustrating the operation of FIG. 30.
Figure 32:
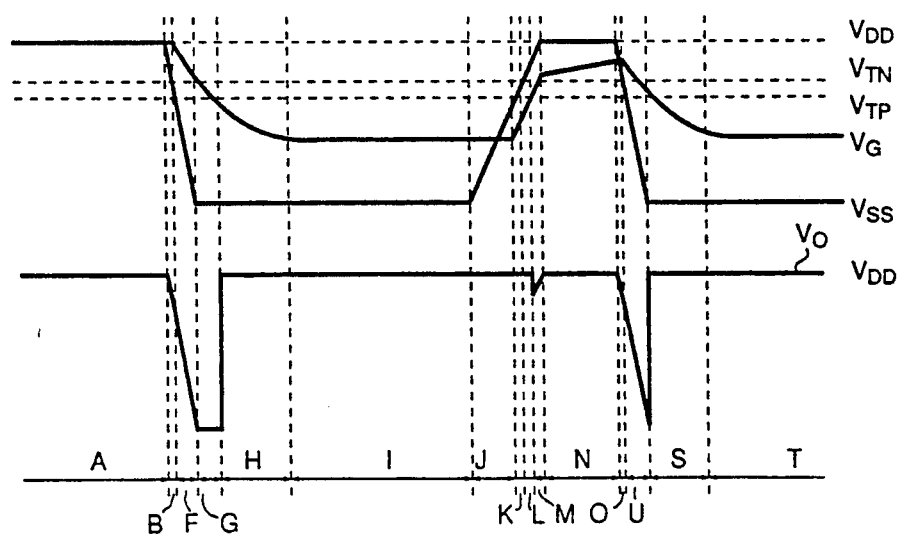
FIG. 32 is another voltage waveform diagram illustrating the operation of FIG. 30.

The operation of the twelfth embodiment is illustrated in FIG. 31 for the case of a slow-rising power supply and in FIG. 32 for the case of a fast-rising power supply, the rise of the power supply being depicted as a fall of $V_{SS}$. The waveforms are the same as in FIGS. 28 and 29 but with positive and negative reversed. A detailed description will be omitted, the operation of the twelfth embodiment being analogous to the operation of the eleventh. The twelfth embodiment provides the same effects for an active-low reset signal as are provided for an active-high reset signal by the eleventh embodiment.

The preceding embodiments have addressed the problems of assuring reset signal output even when the steady-state supply voltage is low, even when the supply voltage rises quickly, and even after power is interrupted for a brief interval. Modifications to these embodiments will next be shown that enable current flow through the auto-reset circuit to be reduced to zero during, for example, measurements of static current consumption.

13TH EMBODIMENT

Figure 33:
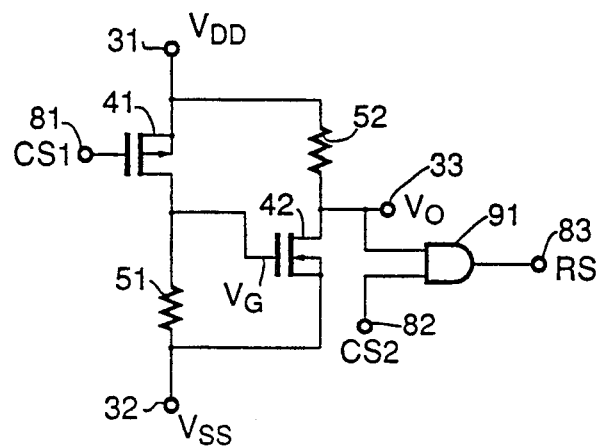
FIG. 33 is a circuit diagram of an auto-reset circuit illustrating a thirteenth embodiment of the invention.

FIG. 33 is a circuit diagram of an auto-reset circuit illustrating a thirteenth embodiment of the invention. Elements identical to elements of the first embodiment shown in FIG. 1 have the same reference numerals.

In this auto-reset circuit, the gate (third terminal) of the P-MOSFET 41 shown in FIG. 1 is coupled to a control signal input terminal 81 which receives a control signal CS1, and output terminal 33 is coupled to the first input terminal of a two-input AND gate 91. The second input terminal of the AND gate 91 is coupled to another control signal input terminal 82, which receives a control signal CS2. The output side of AND gate 91 is coupled to an output terminal 83. The reset signal RS is the signal output from output terminal 83; that is, the reset signal RS is gated by AND gate 91.

During normal operation, control signal CS1 is held low and control signal CS2 is held high. The gate potential of P-MOSFET 41 is therefore $V_{SS}$ as in FIG. 1, and the outputs at output terminals 33 and 83 are either both high or both low. This circuit accordingly operates in substantially the same way as the first embodiment.

To measure the static current consumption of an LSI or other device containing this auto-reset circuit without placing the device in the reset state, control signal CS1 is driven high and control signal CS2 low. The gate and source of P-MOSFET 41 are now both at the $V_{DD}$ level, so P-MOSFET 41 turns off. The gate potential of N-MOSFET 42 is then pulled down through resistor 51 to $V_{SS}$, so N-MOSFET 42 also turns off. Accordingly, no current flows through the auto-reset circuit. Output terminal 33 is pulled up through resistor 52 to the $V_{DD}$ level, but since control signal CS2 is low, the reset signal RS output at output terminal 83 remains low.

To measure static current consumption in the reset state, or to verify output of the reset signal RS, it suffices to drive control signals CS1 and CS2 both high. Current flow through the auto-reset circuit stops, and the resulting high potential at output terminal 33 is passed through AND gate 91 and output as a reset signal RS at output terminal 83.

Another useful possibility is to route the signal from output terminal 33 to some circuits in an LSI or other device, and the signal from output terminal 83 to other circuits. Static current consumption can then be measured in either a partially or a completely initialized state.

If all static current tests will be performed in the reset state, then AND gate 91 can be eliminated and the reset signal RS taken directly from output terminal 33.

The advantage of performing static current tests with current flow through the auto-reset circuit cut off is that it removes the ambiguity resulting from inexact knowledge of the size of that current. That is, it improves the resolution of the tests, enabling more accurate identification of devices with photolithography defects or other defects that might impair long-term reliability.

14TH EMBODIMENT

Figure 34:
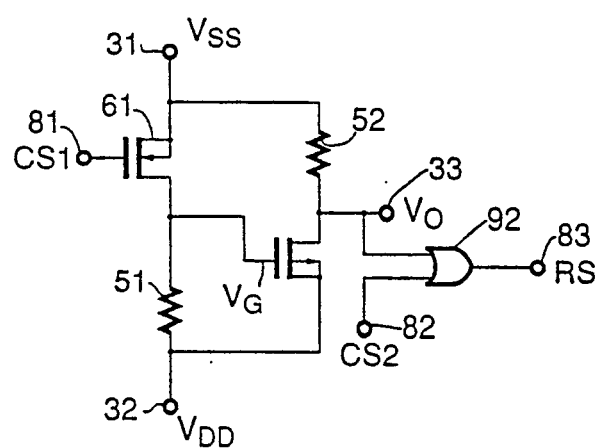
FIG. 34 is a circuit diagram of an auto-reset circuit illustrating a fourteenth embodiment of the invention.

FIG. 34 is a circuit diagram of an auto-reset circuit illustrating a fourteenth embodiment of the invention. Elements identical to elements of the second embodiment shown in FIG. 3 have the same reference numerals.

In this embodiment, the gate of N-MOSFET 61 is coupled to a control signal input terminal 81, and output terminal 33 is coupled to the first input terminal of a two-output OR gate 92. The second input terminal of the OR gate 92 is coupled to another control signal input terminal 82 and the output side of OR gate 92 is coupled to an output terminal 83. As in the thirteenth embodiment, the inputs at control signal input terminals 81 and 82 are control signals CS1 and CS2, and the reset signal RS, which is active low, is taken from output terminal 83; that is, the reset signal RS is gated by OR gate 92.

During normal operation, control signal CS1 is high and control signal CS2 is low, and this embodiment operates like the second embodiment. During static current measurements, control signal CS1 is driven low to turn off N-MOSFET 61. The gate potential $V_G$ of P-MOSFET 62 is then pulled up to $V_{DD}$ through resistor 51, so P-MOSFET 62 also turns off and current flow through the auto-reset circuit ceases. If the measurement is to be performed in the reset state, control signal CS2 is left low, permitting output of a low reset signal RS from output terminal 83; otherwise, control signal CS2 is driven high, forcing RS to remain inactive (high).

This embodiment has the same effect as the thirteenth embodiment, the only difference being that the meanings of the high and low levels of the reset and control signals are reversed.

15TH EMBODIMENT

Figure 35:
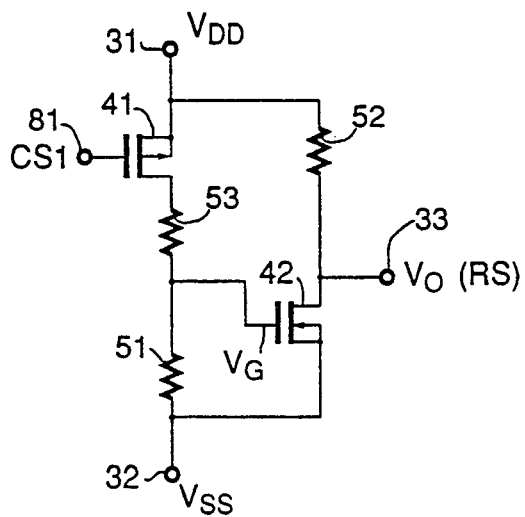
FIG. 35 is a circuit diagram of an auto-reset circuit illustrating a fifteenth embodiment of the invention.

FIG. 35 is a circuit diagram of an auto-reset circuit illustrating a fifteenth embodiment of the invention. Elements identical to elements of the third embodiment shown in FIG. 5 have the same reference numerals. In this auto-reset circuit, the gate of P-MOSFET 41 is coupled to a control signal input terminal 81 which receives a control signal CS1.

Control signal CS1 is driven low during normal operation and high during static current measurements. If it is necessary to prevent output of a reset signal during such measurements, an AND gate can be coupled to output terminal 33 as in the thirteenth embodiment. This embodiment combines features of the third and thirteenth embodiments, enabling current flow through the auto-reset circuit to be reduced to zero for test purposes.

16TH EMBODIMENT

Figure 36:
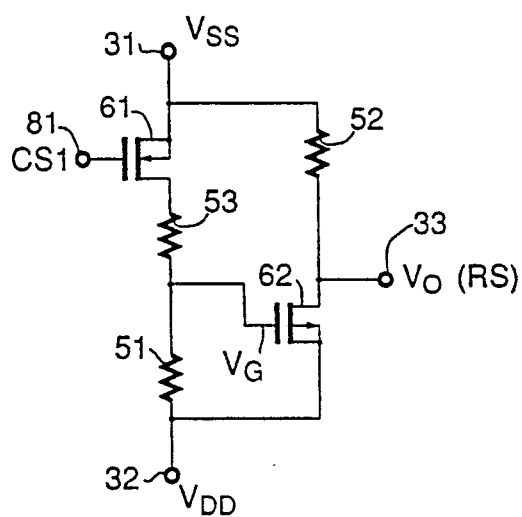
FIG. 36 is a circuit diagram of an auto-reset circuit illustrating a sixteenth embodiment of the invention.

FIG. 36 is a circuit diagram of an auto-reset circuit illustrating a sixteenth embodiment of the invention. Elements identical to elements of the fourth embodiment shown in FIG. 7 have the same reference numerals. In this auto-reset circuit, the gate of N-MOSFET 61 is coupled to a control signal input terminal 81 that receives a control signal CS1.

Control signal CS1 is driven high during normal operation and low during static current measurements. If it is necessary to prevent output of a reset signal during such measurements, an OR gate can be coupled to output terminal 33 as in the fourteenth embodiment. Like the fourteenth embodiment, the sixteenth embodiment enables current flow through the auto-reset circuit to be reduced to zero during the measurement.

17TH EMBODIMENT

Figure 37:
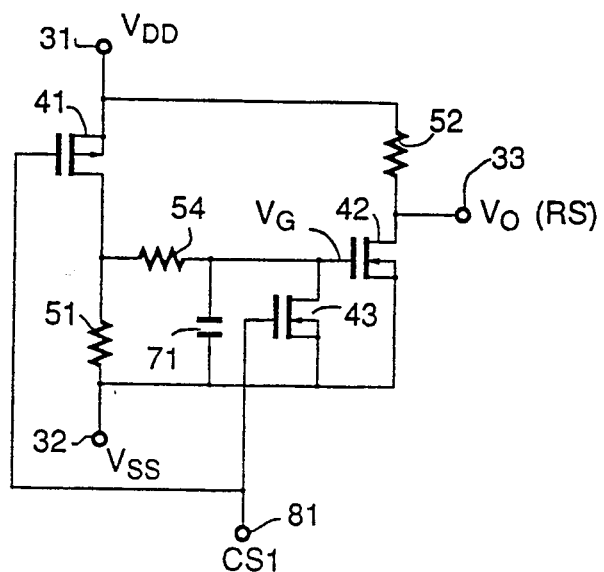
FIG. 37 is a circuit diagram of an auto-reset circuit illustrating a seventeenth embodiment of the invention.

FIG. 37 is a circuit diagram of an auto-reset circuit illustrating a seventeenth embodiment of the invention. Elements identical to elements of the fifth embodiment shown in FIG. 9 have the same reference numerals.

This embodiment has three three-terminal active elements, the first and second being the P-MOSFET 41 and N-MOSFET 42 shown in FIG. 9, and the third being another N-MOSFET 43. The gates of P-MOSFET 41 and N-MOSFET 43 are both coupled to a control signal input terminal 81 that receives a control signal CS1. The drain of N-MOSFET 43 is coupled to the gate of N-MOSFET 42. The source of N-MOSFET 43 is coupled to the second power-supply terminal 32.

During normal operation control signal CS1 is held low, turning off N-MOSFET 43 and allowing P-MOSFET 41 to turn on when $V_{DD}$ rises. The circuit accordingly operates as did the fifth embodiment illustrated in FIG. 9. During static current measurements control signal CS1 is driven high, turning P-MOSFET 41 off and N-MOSFET 43 on. Capacitor 71 and the gate of N-MOSFET 42 are coupled through N-MOSFET 43 to the second power-supply terminal 32, so capacitor 71 rapidly discharges and the gate potential $V_G$ of N-MOSFET 42 drops to the $V_{SS}$ level, turning N-MOSFET 42 off. With P-MOSFET 41 and N-MOSFET 42 off and capacitor 71 discharged, no current flows and accurate static current measurements can be carried out.

While CS1 is high an active (high) reset signal RS is output from output terminal 33. If necessary, this reset output can be controlled by a second control signal, by coupling an AND gate to output terminal 33 as in the thirteenth embodiment.

18TH EMBODIMENT

Figure 38:
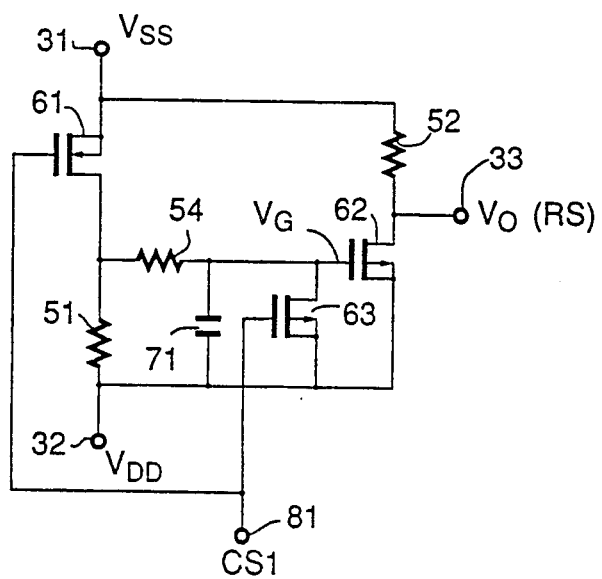
FIG. 38 is a circuit diagram of an auto-reset circuit illustrating a eighteenth embodiment of the invention.

FIG. 38 is a circuit diagram of an auto-reset circuit illustrating an eighteenth embodiment of the invention. Elements identical to elements of the sixth and seventeenth embodiments shown in FIGS. 12 and 37 have the same reference numerals.

This embodiment has the same circuit topology as the seventeenth embodiment, but the first active element is an N-MOSFET 61, the second active element is a P-MOSFET 62, the third active element is a P-MOSFET 63, $V_{SS}$ is input to the first power-supply terminal 31, and $V_{DD}$ is input to the second power-supply terminal 32. Control signal CS1 is driven high during normal operation and low during static current measurements.

The effect of this embodiment in cutting off current flow during such measurements is the same as in the seventeenth embodiment. If it is necessary to prevent output of an active (low) reset signal during the measurements, an OR gate can be coupled to the output terminal 33 as in the fourteenth embodiment.

19TH EMBODIMENT

Figure 39:
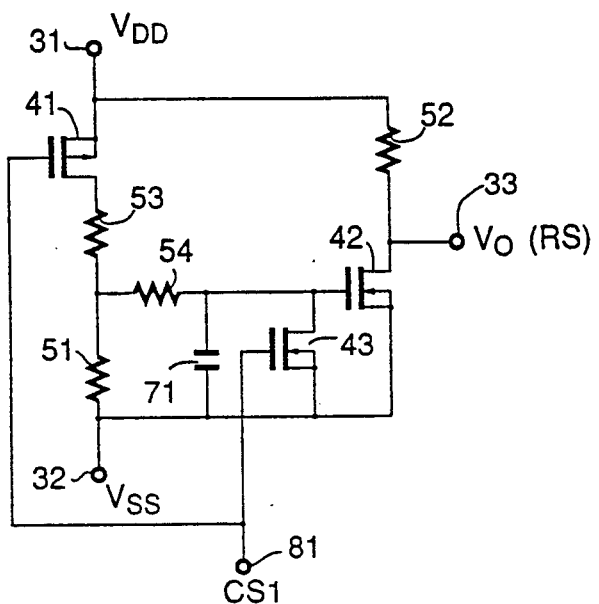
FIG. 39 is a circuit diagram of an auto-reset circuit illustrating a nineteenth embodiment of the invention.

FIG. 39 is a circuit diagram of an auto-reset circuit illustrating a nineteenth embodiment of the invention. Elements identical to elements of the seventh and seventeenth embodiments shown in FIGS. 15 and 37 have the same reference numerals.

When a low control signal CS1 is input at control signal input terminal 81, this embodiment operates like the seventh embodiment, as shown in FIGS. 16 and 17. When control signal CS1 is driven high, P-MOSFET 41 turns off, N-MOSFET 43 turns on, capacitor 71 discharges, and N-MOSFET 42 turns off, cutting off current flow as in the seventeenth embodiment and permitting static current consumption to be measured accurately. If necessary, an AND gate can be coupled to output terminal 33 as in the thirteenth embodiment, to control reset signal output during the measurement.

20TH EMBODIMENT

Figure 40:
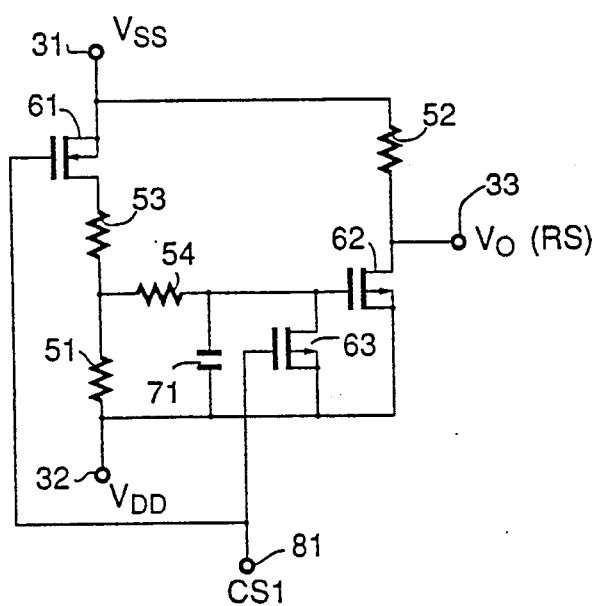
FIG. 40 is a circuit diagram of an auto-reset circuit illustrating a twentieth embodiment of the invention.

FIG. 40 is a circuit diagram of an auto-reset circuit illustrating a twentieth embodiment of the invention. Elements identical to elements of the eighth and eighteenth embodiments shown in FIGS. 18 and 38 have the same reference numerals.

When a high control signal CS1 is input at control signal input terminal 81, this embodiment operates like the eighth embodiment, as shown in FIGS. 19 and 20. When control signal CS1 is driven low, N-MOSFET 61 turns off, P-MOSFET 63 turns on, capacitor 71 discharges, and P-MOSFET 62 turns off, cutting off current flow as in the eighteenth embodiment and permitting static current to be measured accurately. If necessary, an OR gate can be coupled to output terminal 33 as in the fourteenth embodiment, to control reset signal output during the measurement.

21ST EMBODIMENT

Figure 41:
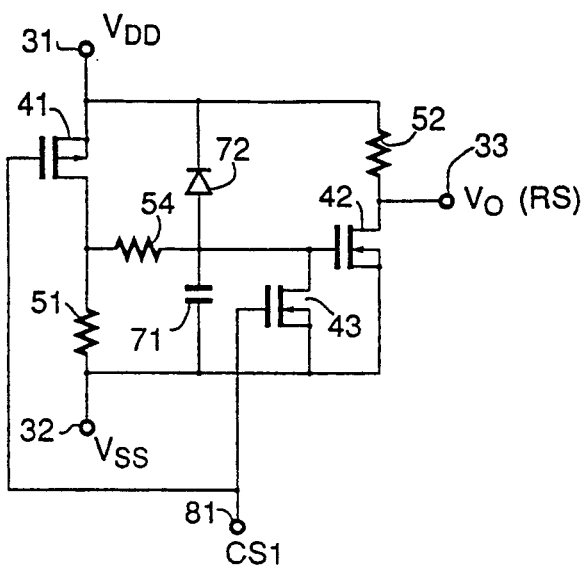
FIG. 41 is a circuit diagram of an auto-reset circuit illustrating a twenty-first embodiment of the invention.

FIG. 41 is a circuit diagram of an auto-reset circuit illustrating a twenty-first embodiment of the invention. Elements identical to elements of the ninth and seventeenth embodiments shown in FIGS. 21 and 37 have the same reference numerals.

When a low control signal CS1 is input at control signal input terminal 81, this embodiment operates like the ninth embodiment, as shown in FIGS. 22 and 23. When control signal CS1 is driven high, P-MOSFET 41 turns off, N-MOSFET 43 turns on, capacitor 71 discharges, and N-MOSFET 42 turns off, cutting off current flow as in the seventeenth embodiment and permitting static current to be measured accurately. If necessary, an AND gate can be coupled to output terminal 33 as in the thirteenth embodiment, to control reset signal output during the measurement.

22ND EMBODIMENT

Figure 42:
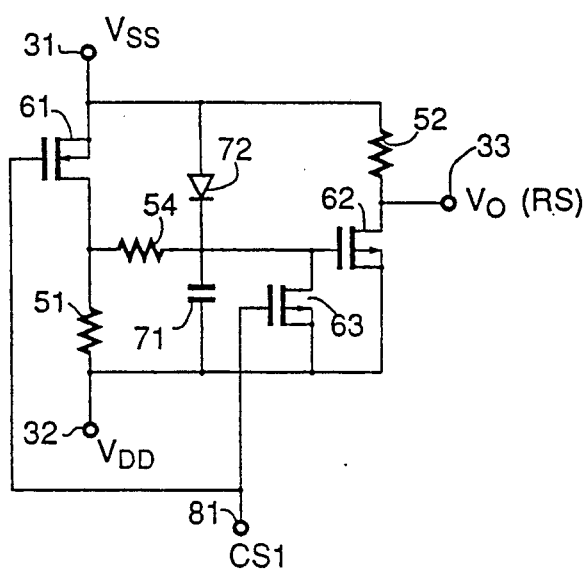
FIG. 42 is a circuit diagram of an auto-reset circuit illustrating a twenty-second embodiment of the invention.

FIG. 42 is a circuit diagram of an auto-reset circuit illustrating a twenty-second embodiment of the invention. Elements identical to elements of the tenth and eighteenth embodiments shown in FIGS. 24 and 38 have the same reference numerals.

When a high control signal CS1 is input at control signal input terminal 81, this embodiment operates like the tenth embodiment, as shown in FIGS. 25 and 26. When control signal CS1 is driven high, N-MOSFET 61 turns off, P-MOSFET 63 turns on, capacitor 71 discharges, and P-MOSFET 62 turns off, cutting off current flow as in the eighteenth embodiment and permitting static current to be measured accurately. If necessary, an OR gate can be coupled to output terminal 33 as in the fourteenth embodiment, to control reset signal output during the measurement.

23RD EMBODIMENT

Figure 43:
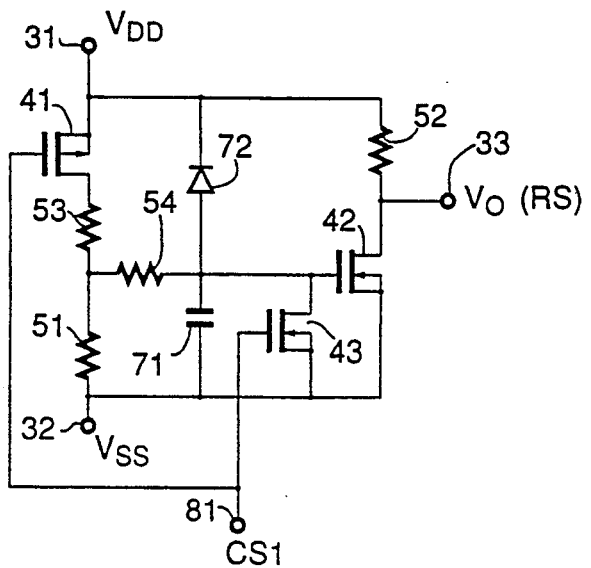
FIG. 43 is a circuit diagram of an auto-reset circuit illustrating a twenty-third embodiment of the invention.

FIG. 43 is a circuit diagram of an auto-reset circuit illustrating a twenty-third embodiment of the invention. Elements identical to elements of the eleventh and seventeenth embodiments shown in FIGS. 27 and 37 have the same reference numerals.

When a low control signal CS1 is input at control signal input terminal 81, this embodiment operates like the eleventh embodiment, as shown in FIGS. 28 and 29. When control signal input terminal 81 is driven high, P-MOSFET 41 turns off, N-MOSFET 43 turns on, capacitor 71 discharges, and N-MOSFET 42 turns off, cutting off current flow as in the seventeenth embodiment and permitting static current to be measured accurately. If necessary, an AND gate can be coupled to output terminal 33 as in the thirteenth embodiment, to control reset signal output during the measurement.

24TH EMBODIMENT

Figure 44:
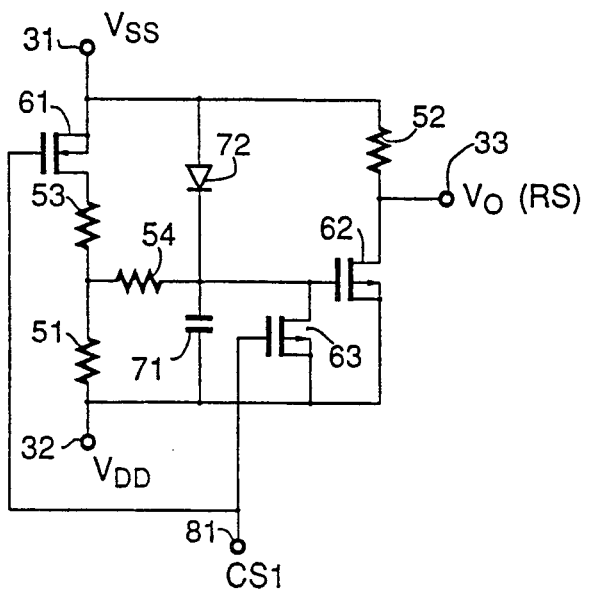
FIG. 44 is a circuit diagram of an auto-reset circuit illustrating a twenty-fourth embodiment of the invention.

FIG. 44 is a circuit diagram of an auto-reset circuit illustrating a twenty-fourth embodiment of the invention. Elements identical to elements of the twelfth and eighteenth embodiments shown in FIGS. 30 and 38 have the same reference numerals.

When a high control signal CS1 is input at control signal input terminal 81, this embodiment operates like the twelfth embodiment, as shown in FIGS. 31 and 32. When control signal input terminal 81 is driven high, N-MOSFET 61 turns off, P-MOSFET 63 turns on, capacitor 71 discharges, and P-MOSFET 62 turns off, cutting off current flow as in the eighteenth embodiment and permitting static current to be measured accurately. If necessary, an OR gate can be coupled to output terminal 33 as in the fourteenth embodiment, to control reset signal output during the measurement.

A basic feature of the preceding embodiments has been that the gate of the first active element is coupled to the second power-supply terminal 32, as shown in the first and second embodiments. The third through twenty-fourth embodiments have shown various features in addition to this basic feature. The remaining embodiments will show how these additional features can also be applied when the gate of the first active element is connected to its drain, and will describe certain waveforms associated with these embodiments in more detail.

25TH EMBODIMENT

Figure 45:
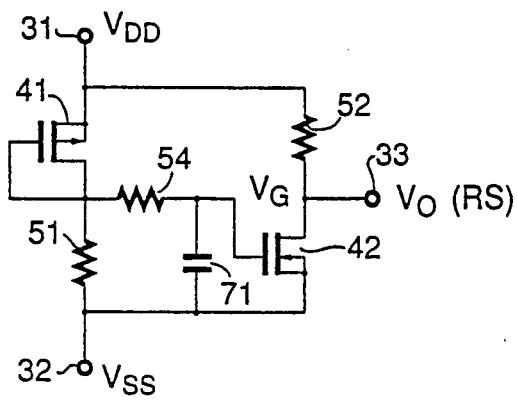
FIG. 45 is a circuit diagram of an auto-reset circuit illustrating a twenty-fifth embodiment of the invention.

FIG. 45 is a circuit diagram of an auto-reset circuit illustrating a twenty-fifth embodiment of the invention. Elements identical to elements of the fifth embodiment shown in FIG. 9 have the same reference numerals.

This embodiment differs from the fifth in that the gate and drain of P-MOSFET 41 are mutually interconnected, instead of the gate being coupled to the second power-supply terminal 32 as in FIG. 9. P-MOSFET 41 therefore operates as a so-called PMOS diode, conducting in only one direction.

The operation of the twenty-fifth embodiment will be explained with reference to FIGS. 46 and 47.

Figure 46:
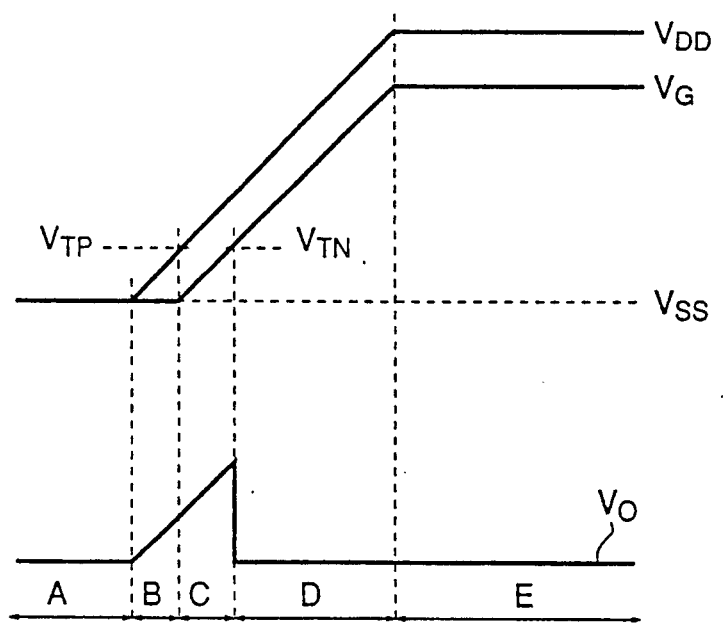
FIG. 46 is a voltage waveform diagram illustrating the operation of FIG. 45.

FIG. 46 is a voltage waveform diagram illustrating the case in which $V_{DD}$ rises slowly in relation to the time constant of resistor 54 and capacitor 71. The threshold voltages $V_{TP}$ and $V_{TN}$ of the P-MOSFET 41 and N-MOSFET 42 are shown as being equal, but this is not a restriction. This embodiment remains applicable when $V_{TP}$ and $V_{TN}$ differ as, for example, in FIG. 10.

In interval A in FIG. 46, before power-up $V_{DD}$, $V_G$, and $V_O$ are all at the $V_{SS}$ level and capacitor 71 is discharged. Next, power is turned on and $V_{DD}$ begins to rise.

In interval B, before $V_{DD}-V_{SS}$ reaches the threshold voltage $V_{TP}$ of P-MOSFET 41, since P-MOSFET 41 is turned off, the gate potential of P-MOSFET 41 is pulled down through resistor 51 to the $V_{SS}$ level. Similarly, the gate potential $V_G$ of N-MOSFET 42 is pulled down through resistors 51 and 54 to the $V_{SS}$ level, so capacitor 71 remains discharged, N-MOSFET 42 remains off, and the output voltage at output terminal 33 begins to rise together with $V_{DD}$.

In interval C in FIG. 46, $V_{DD}-V_{SS}$ exceeds the threshold voltage $V_{TP}$ of P-MOSFET 41 and P-MOSFET 41 turns on. Since its gate and drain are interconnected, however, P-MOSFET does not turn on hard. If the resistance of resistor 51 is sufficiently high, the gate-source voltage of P-MOSFET 41, which equals the voltage drop across P-MOSFET 41, stays near $V_{TP}$. The drain and gate potentials of MOSFET 41 follow the rise of $V_{DD}$, staying substantially equal to $V_{DD}-V_{TP}$. This potential is provided through resistor 54 to capacitor 71 and the gate of N-MOSFET 42, causing the gate potential $V_G$ of N-MOSFET 42 also to rise.

Since $V_{DD}$ is rising slowly in relation to the time constant of resistor 54 and capacitor 71, $V_G$ stays substantially equal to $V_{DD}-V_{TP}$, rising parallel to $V_{DD}$ as shown in FIG. 46. In interval C, in which $V_G-V_{SS}$ is below the threshold voltage $V_{TN}$ of N-MOSFET 42, N-MOSFET 42 remains off and the output voltage $V_O$ continues to rise together with $V_{DD}$.

In interval D, when $V_{DD}$ increases further, $V_G-V_{SS}$ exceeds $V_{TN}$, so N-MOSFET 42 turns on and the output voltage $V_O$ at the output terminal 33 reverts to the $V_{SS}$ level. This state is maintained in interval E.

In interval E, $V_{DD}$ is at its steady-state value, $V_G$ holds constant at about $V_{DD}-V_{TP}$, N-MOSFET 42 remains on, and the reset signal remains at the $V_{SS}$ level.

The steady-state supply voltage $V_{DD}-V_{SS}$ should be high enough to assure that N-MOSFET 42 will turn on hard when its gate potential is $V_G$ is equal to $V_{DD}-V_{TP}$. If that condition is satisfied, the operation depicted in FIG. 46 is essentially the same as the operation of the fifth embodiment shown in FIG. 10.

Figure 47:
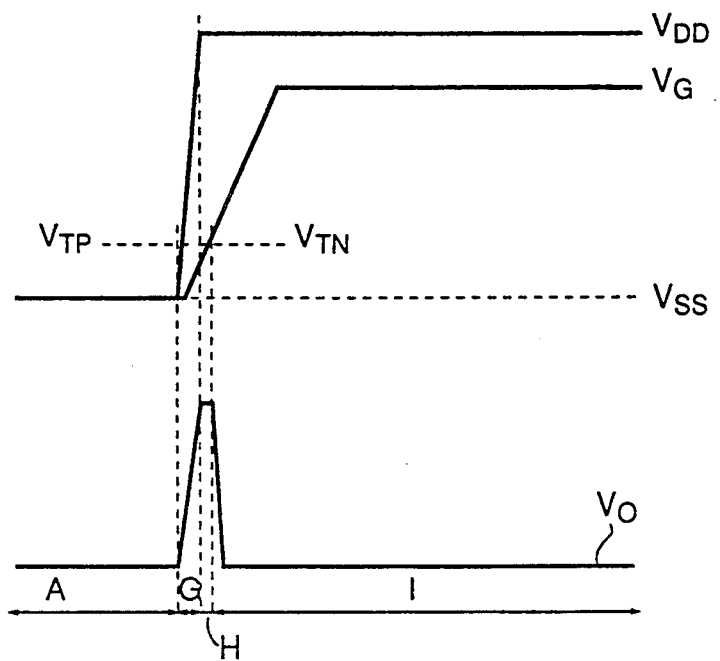
FIG. 47 is another voltage waveform diagram illustrating the operation of FIG. 45.

FIG. 47 is a voltage waveform diagram illustrating the case in which $V_{DD}$ rises rapidly in relation to the time constant of resistor 54 and capacitor 71. Again the threshold voltages $V_{TP}$ and $V_{TN}$ of P-MOSFET 41 and N-MOSFET 42 are shown as equal.

In interval G, $V_{DD}$ rises quickly to its steady-state value. $V_G$ rises at a slower rate controlled by the time constant of resistor 54 and capacitor 71, and $V_G-V_{SS}$ does not reach the threshold voltage $V_{TN}$ of N-MOSFET 42 until the end of interval H, when $V_{DD}$ has already attained its steady state. A reset signal is output during intervals G and H. In interval I, $V_G-V_{SS}$ exceeds $V_{TN}$, so N-MOSFET turns on and the reset signal RS returns to the $V_{SS}$ level, while $V_G$ continues to rise to its steady-state value of $V_{DD}-V_{TP}$.

Although the potential $V_O$ of the reset signal RS has been described as rising together with $V_{DD}$, the actual waveform depends on the capacitive load coupled to output terminal 33. Circuit constants should be selected so that this load has time to charge adequately before $V_G-V_{SS}$ reaches $V_{TN}$. As an example, if the capacitive load is 0.5 picofarads, the resistances of resistors 51, 52, and 54 are 500 kilohms, the threshold voltages $V_{TP}$ and $V_{TN}$ are 0.7 V, and the supply voltage rises to a steady state of 5 V in a few hundred nanoseconds, then a capacitance of about 3 picofarads for capacitor 71 should provide a usable reset signal.

26TH EMBODIMENT

Figure 48:
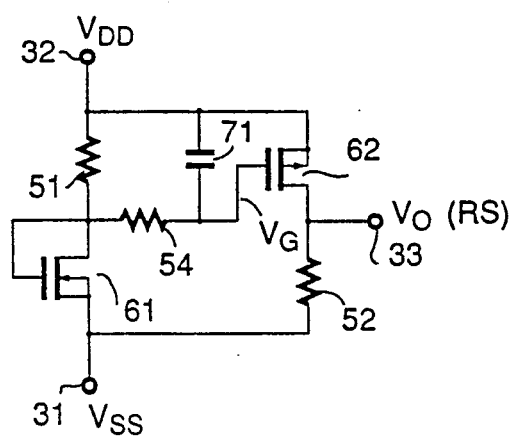
FIG. 48 is a circuit diagram of an auto-reset circuit illustrating a twenty-sixth embodiment of the invention.

FIG. 48 is a circuit diagram of an auto-reset circuit illustrating a twenty-sixth embodiment of the invention. Elements identical to elements of the sixth embodiment shown in FIG. 12 have the same reference numerals.

The twenty-sixth embodiment has the same circuit topology as the twenty-fifth, with the gate and drain of the first active element interconnected, but that first active element is now an N-MOSFET 61, while the second active element is a P-MOSFET 62, and $V_{SS}$ is applied to the first power-supply terminal 31, while $V_{DD}$ is applied to the second power-supply terminal 32.

Figure 49:
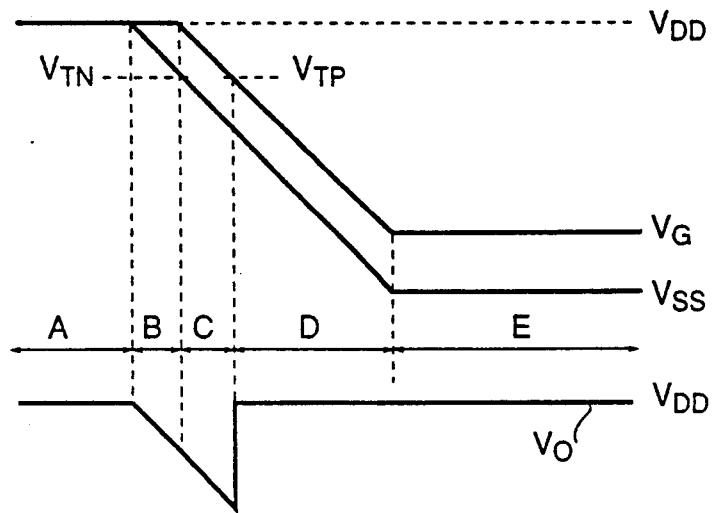
FIG. 49 is a voltage waveform diagram illustrating the operation of FIG. 48.
Figure 50:
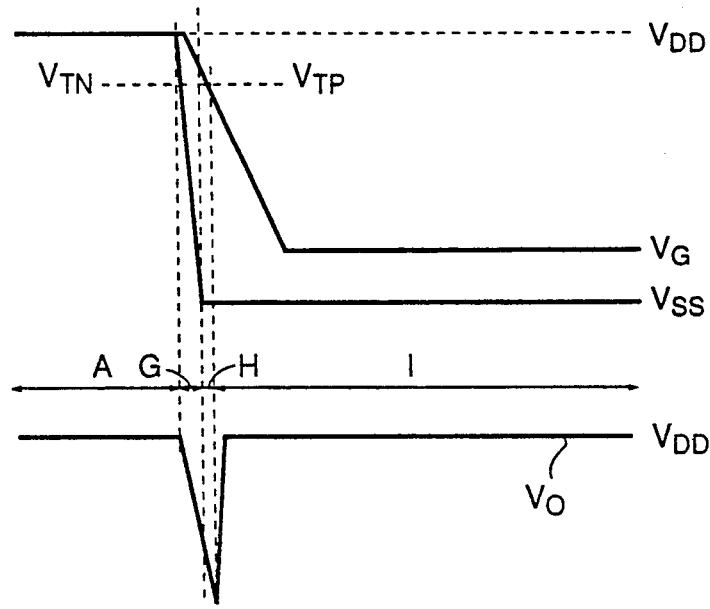
FIG. 50 is another voltage waveform diagram illustrating the operation of FIG. 48.

The operation of the twenty-sixth embodiment is illustrated in FIG. 49 for the case of a slowly-rising power supply, and in FIG. 50 for the case of a quickly-rising power supply, the rise of the power supply in both cases being shown as a fall of $V_{SS}$. The operation is analogous to the operation of the twenty-fifth embodiment as shown in FIGS. 46 and 47, with positive and negative reversed, so a detailed description will be omitted.

Figure 51:
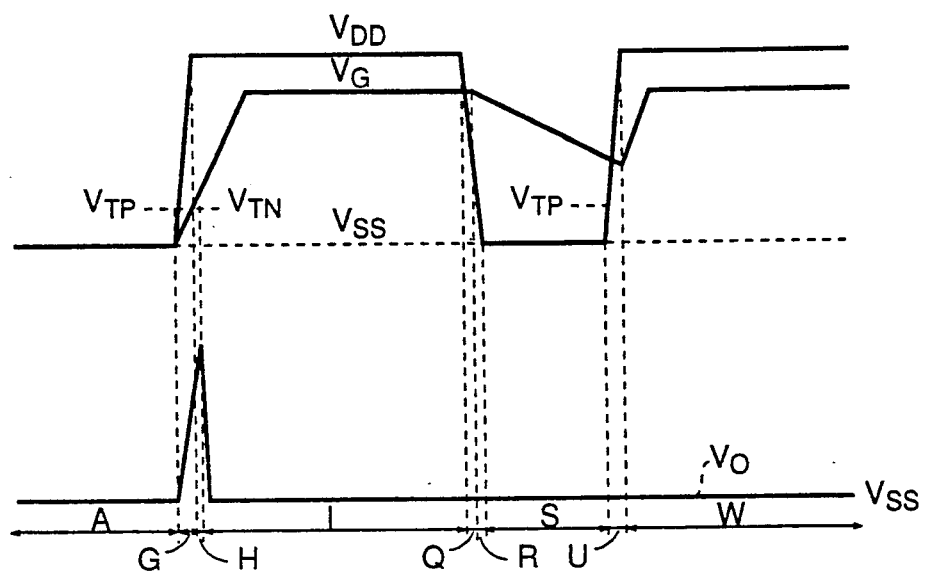
FIG. 51 is a voltage waveform diagram of a momentary power loss in FIG. 45.
Figure 52:
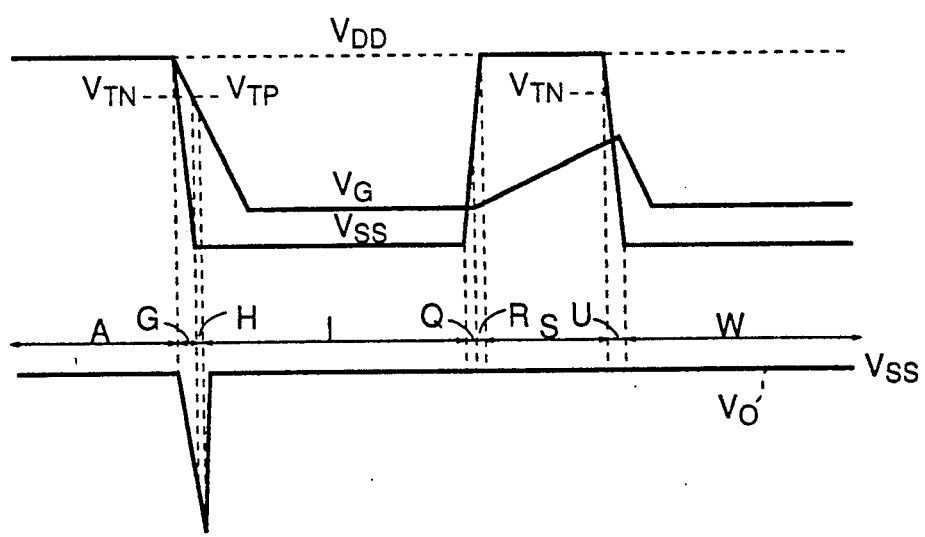
FIG. 52 is a voltage waveform diagram of a momentary power loss in FIG. 48.

Instead, a description will be given of the behavior of the twenty-fifth and twenty-sixth embodiments when there is a momentary power interruption (lasting about 1 microsecond, for example) during steady-state operation. FIG. 51 illustrates this behavior for the twenty-fifth embodiment with a fast-rising power supply. FIG. 52 illustrates this behavior for the twenty-sixth embodiment, also with a fast-rising power supply.

In FIG. 51, the waveforms in intervals A, G, H, and I are the same as in FIG. 47. In interval I capacitor 71 charges to a steady-state potential $V_G$ of $V_{DD}-V_{TP}$ as discussed above.

In interval Q, at the onset of the power interruption $V_{DD}$ begins to fall. The drain voltage of P-MOSFET 41 also begins to fall, allowing capacitor 71 to start discharging through resistor 54, thence through resistor 51 to the $V_{SS}$ level at the second power-supply terminal 32.

In this example $V_{DD}$ falls at the same rate at which it rose, this rate being rapid in comparison with the time constant of resistor 54 and capacitor 71. During interval Q, capacitor 71 is barely able to discharge at all and the gate potential of P-MOSFET 41 is held up by the charge in capacitor 71. In interval R, the gate potential of P-MOSFET 41 becomes equal to or higher than both the source and drain potentials of P-MOSFET 41, which accordingly turns off. Capacitor 71 is thereby prevented from discharging through P-MOSFET 41; it can discharge only through resistors 54 and 51 to terminal 32, which is at the $V_{SS}$ level. This discharge continues after $V_{DD}$ has dropped to the $V_{SS}$ level, in interval S in FIG. 51.

To produce any reset signal at all when power is recovered, the gate potential of N-MOSFET 42 must be reduced at least to 0.7 V. If resistors 54 and 51 have resistances of 500 kilohms, the threshold voltage $V_{TP}$ of P-MOSFET 41 is 0.7 V, the steady-state $V_{DD}$ and $V_{SS}$ values are 5 V and 0 V, respectively, and capacitor 71 has a capacitance of 3 picofarads, then it takes capacitor 71 approximately 5.4 microseconds to discharge from its steady-state value of 4.3 V to 0.7 V. To produce a dependable rest signal, the gate potential $V_G$ of N-MOSFET 42 must be reduced to an even lower value such as 0.2 V, but this takes still longer: approximately 9.2 microseconds.

If the power interruption lasts only about one microsecond, when power is recovered in interval U, the gate-source voltage $V_G - V_{SS}$ of N-MOSFET 42 is still far above the threshold voltage $V_{TN}$, so N-MOSFET 42 is still in the on state and no reset signal is produced. The reset signal is undependable for power interruptions lasting less than approximately 9.2 microseconds.

FIG. 52, which shows the behavior of the twenty-sixth embodiment in a momentary power interruption, is analogous to FIG. 51 with positive and negative reversed, so a detailed description will be omitted. Once again, no reset signal is output at all for a power interruption on the order of one microsecond, and with the circuit constants mentioned above, output of a reset signal remains undependable for power interruptions lasting up to about 9.2 microseconds.

It should be added that failure to output a reset signal at minor power interruptions is not always a disadvantage, since it also prevents the generations of unwanted reset signals due to power-supply noise. For power interruptions of the magnitude shown in FIGS. 51 and 52, however, a reset signal is generally desired. To obtain a reliable reset signal, the twenty-fifth and twenty-sixth embodiments can be modified by adding the diode of the ninth and tenth embodiments, as shown next.

27TH EMBODIMENT

Figure 53:
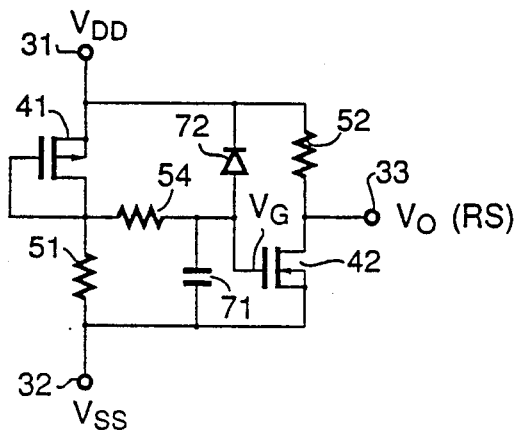
FIG. 53 is a circuit diagram of an auto-reset circuit illustrating a twenty-seventh embodiment of the invention.

FIG. 53 is a circuit diagram of an auto-reset circuit illustrating a twenty-seventh embodiment of the invention. Elements identical to elements of the ninth embodiment shown in FIG. 21 have the same reference numerals. This embodiment has the same circuit topology as the ninth, except that the gate and drain of P-MOSFET 41 are interconnected as in the twenty-fifth embodiment.

Figure 54:
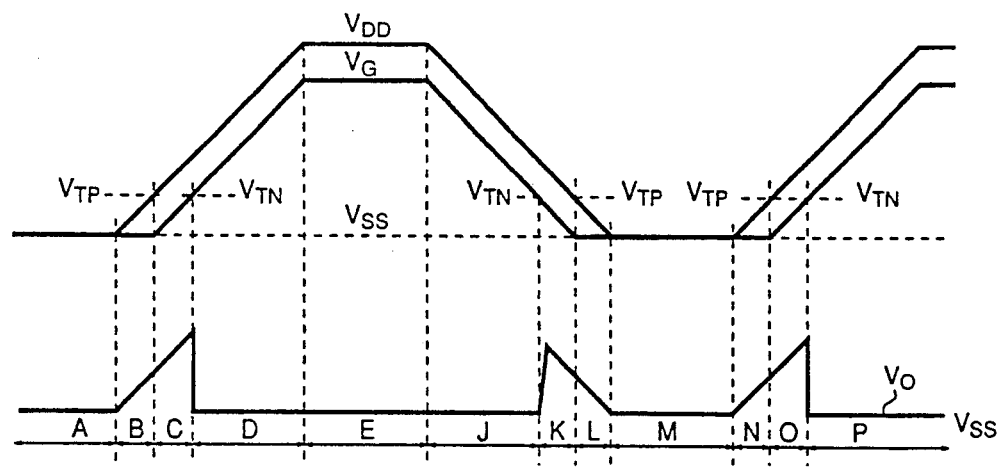
FIG. 54 is a voltage waveform diagram illustrating the operation of FIG. 53.

FIG. 54 is a voltage waveform diagram illustrating the operation of the twenty-seventh embodiment with a slowly-rising power supply. The waveforms in intervals A through E are substantially the same as the waveforms of the twenty-fifth embodiment illustrated in FIG. 46.

In interval J a power interruption occurs and $V_{DD}$ falls at the same rate at which it rose, the rate being controlled by a time constant of the power supply. If the fall occurs over a period of several tens of milliseconds, for example, and resistors 51 and 54 have resistances of 500 kilohms while capacitor 71 has a capacitance of 3 picofarads (giving them a time constant of 3 microseconds), then capacitor 71 is able to discharge at a substantially matching rate, so the gate potential $V_G$ of N-MOSFET 42 and the gate and drain potentials of P-MOSFET 41 all remain substantially equal to $V_{DD} - V_{TP}$. Diode 72 remains in the reverse-biased, hence non-conducting, state.

In interval K in FIG. 54, $V_G - V_{SS}$ becomes less than the threshold voltage $V_{TN}$ of N-MOSFET 42, which accordingly turns off, and the output voltage $V_O$ at output terminal 33 is pulled up through resistor 52 to $V_{DD}$. If the capacitive load coupled to the output terminal 33 is 0.5 picofarads, resistor 52 has a value of 500 kilohms, and the $V_{DD}$ level at this time is 1.4 V, for example, then $V_O$ rises to 1.2 V in about 486 nanoseconds.

In interval L $V_{DD} - V_{SS}$ decreases below the threshold voltage $V_{TP}$ of P-MOSFET 41, which accordingly turns off. By this time capacitor 71 has fully discharged and the gate potential $V_G$ of N-MOSFET 42 is $V_{SS}$.

After remaining at the $V_{SS}$ level in interval M, $V_{DD}$ begins to rise again, and the same operations take place in intervals N, O, and P as occurred in intervals B, C, and D at power-up. A reset signal is generated at both ends of the power interruption: when power is lost in intervals K and L, and when power is regained in intervals N and O.

Next, the operation when $V_{DD}$ rises and falls quickly will be explained with reference to FIG. 55.

Figure 55:
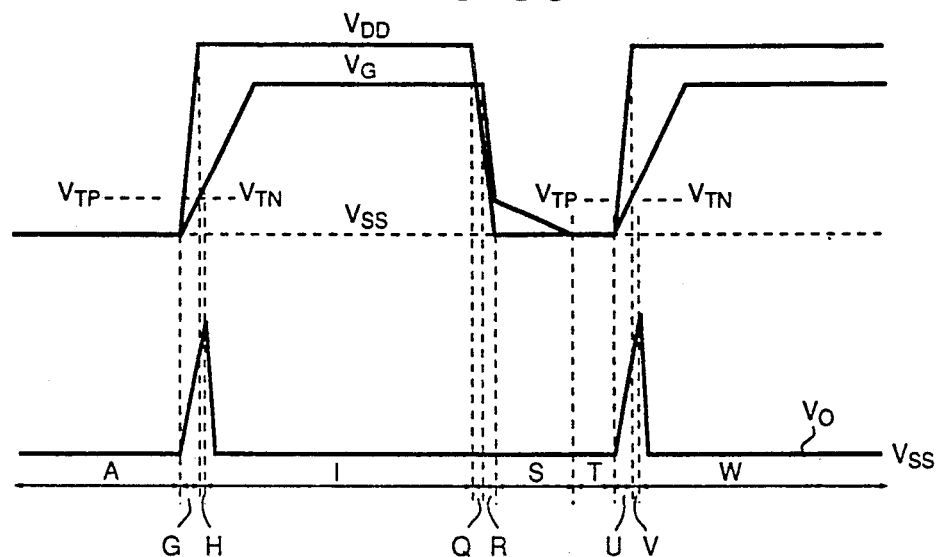
FIG. 55 is another voltage waveform diagram illustrating the operation of FIG. 53.

The waveforms in intervals A, G, H, and I in FIG. 55 are substantially the same as in FIG. 47, which illustrates the twenty-fifth embodiment.

In interval Q, a momentary power failure occurs and $V_{DD}$ falls from its steady state to a value equal to the potential of capacitor 71 minus the threshold voltage of diode 72. This voltage drop affects the drain voltage of P-MOSFET 41 and allows capacitor 71 to discharge through resistor 54, but the interval is too brief for significant discharge to occur. If the resistance of resistors 51 and 54 is 500 kilohms, the capacitance of capacitor 71 is 3 picofarads, the threshold voltages of P-MOSFET 41 and diode 72 are 0.7 V, and $V_{DD}$ falls from a steady-state level of 5.0 V, for example, interval Q is too short for the discharge of capacitor 71 to be noticeable in the drawing. Capacitor 71 remains charged to a potential of substantially 4.3 V.

In interval R, the forward voltage across diode 72 becomes sufficient for current to flow, and capacitor 71 now discharges rapidly through diode 72. This discharge continues until $V_{DD}$ has reached the $V_{SS}$ level and capacitor 71 has discharged to about 0.7 V.

In interval S the forward voltage across diode 72 is insufficient (less than 0.7 V) for substantial current flow, but the discharge of capacitor 71 continues at a more moderate rate through resistors 54 and 51. Since capacitor 71 has already discharged to 0.7 V in interval R, it is able to discharge fully to the $V_{SS}$ level in interval S.

After remaining at the $V_{SS}$ level in interval T, $V_{DD}$ rises again in interval U and the same process takes place in intervals T, U, V, and W as occurred in intervals A, G, H, and I at power-up, resulting in reliable output of a reset signal in intervals U and V.

It is not necessary for $V_G$ to fall all the way to the $V_{SS}$ level in order for a reset signal to be output; it suffices for $V_G$ to be reduced to about 0.2 V. With the above-mentioned circuit constants, capacitor 71 can discharge through resistors 54 and 51 from 0.7 V to 0.2 V in about 3.8 microseconds, enabling a dependable reset signal to be output after a power interruption of that duration, whereas in the twenty-fifth embodiment the necessary duration was approximately 9.2 microseconds.

28TH EMBODIMENT

Figure 56:
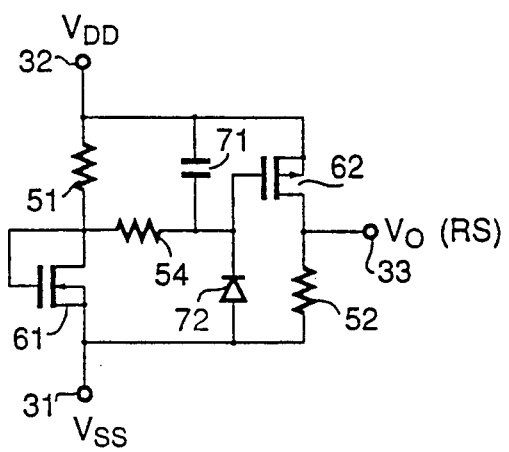
FIG. 56 is a circuit diagram of an auto-reset circuit illustrating a twenty-eighth embodiment of the invention.

FIG. 56 is a circuit diagram of an auto-reset circuit illustrating a twenty-eighth of the invention. Elements identical to elements of the tenth embodiment shown in FIG. 24 have the same reference numerals. Although drawn differently, this auto-reset circuit has the same topology as FIG. 24, except that the gate and drain of N-MOSFET 41 are interconnected as in the twenty-sixth embodiment.

Figure 57:
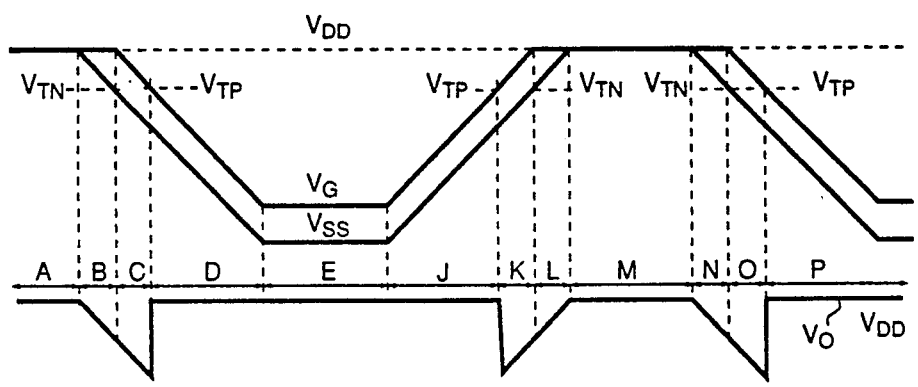
FIG. 57 is a voltage waveform diagram illustrating the operation of FIG. 56.
Figure 58:
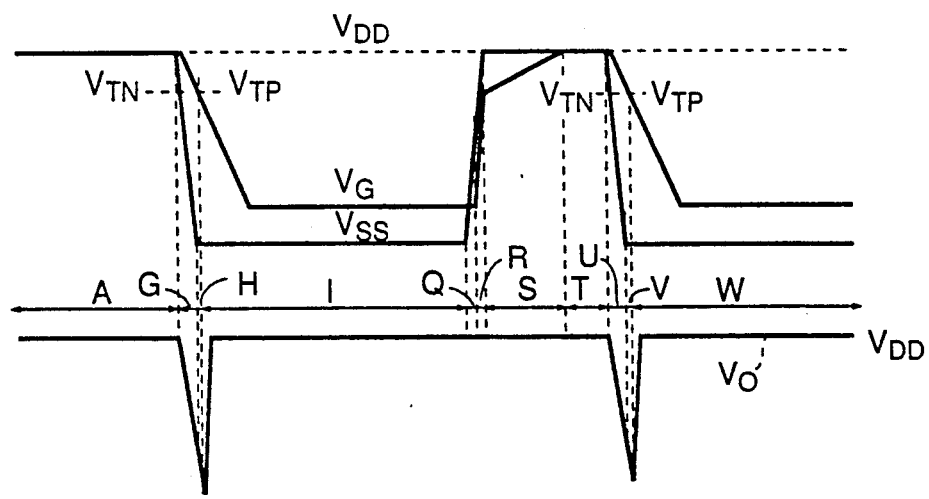
FIG. 58 is another voltage waveform diagram illustrating the operation of FIG. 56.

FIGS. 57 and 58 illustrate the operation of the twenty-eighth embodiment with slow-rising and fast-rising power supplies. A detailed description will be omitted since the operation is exactly analogous to FIGS. 54 and 55 with positive and negative reversed. In FIG. 55 a reliable reset signal is output after a momentary power interruption lasting, for example, as little as 3.8 microseconds.

29TH EMBODIMENT

Figure 59:
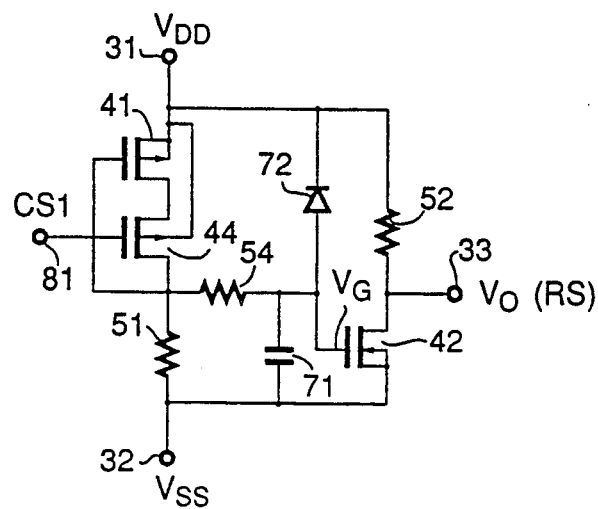
FIG. 59 is a circuit diagram of an auto-reset circuit illustrating a twenty-ninth embodiment of the invention.

FIG. 59 is a circuit diagram of an auto-reset circuit illustrating a twenty-ninth embodiment of the invention. Elements identical to elements of the twenty-seventh embodiment shown in FIG. 53 have the same reference numerals. This embodiment provides a control signal input terminal 81 for stopping current flow through the auto-reset circuit during static current measurements, as in the thirteenth to twenty-fourth embodiments.

In this embodiment a third three-terminal active element is connected in series with the first. The third three-terminal active element is a P-MOSFET 44, which is coupled in series between the gate and drain of the P-MOSFET 41, and also in series between the drain of P-MOSFET 41 and resistors 51 and 54. Specifically, the source of P-MOSFET 44 is coupled to the drain of P-MOSFET 41, and the drain of P-MOSFET 44 is coupled both to the gate of P-MOSFET 41 and to a point between resistors 51 and 54. The gate of P-MOSFET 44 is coupled to control signal input terminal 81, at which a control signal CS1 is input. P-MOSFET 44 is formed in the same substrate or well as P-MOSFET 41, which is biased to the $V_{DD}$ level as indicated in the drawing.

Next the operation of the auto-reset circuit shown in FIG. 59 will be explained with reference to FIGS. 54, 55, and 60.

If control signal CS1 is low, then P-MOSFETs 41 and 44 begin to turn on at almost the same time, and P-MOSFET 44 turns on hard in the steady state. The circuit operates substantially as shown in FIGS. 54 and 55, as if P-MOSFET 44 were not present, diode 72 enabling capacitor 71 to discharge and a reset signal to be output after even a brief power interruption. During the steady state (interval E in FIG. 54 and interval I in FIG. 55), if the supply voltage is 5 V, the threshold voltage $V_{TP}$ of P-MOSFETs 41 and 44 is 0.7 V, and resistors 51 and 52 have resistances of 500 kilohms, then a total current of about 19 microamperes flows from the first power-supply terminal 31 to the second power-supply terminal 32 through P-MOSFETs 41 and 42 and resistor 51, and through resistor 52 and N-MOSFET 42.

Figure 60:
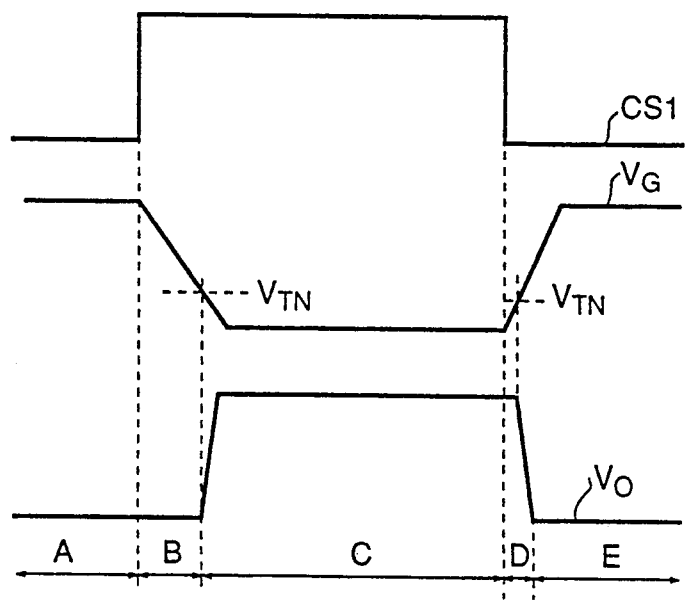
FIG. 60 is a voltage waveform diagram illustrating the operation of FIG. 59.

Referring next to FIG. 60, from the steady state shown in interval A, if control signal CS1 is driven high, P-MOSFET 44 turns off. Capacitor 71 thereupon discharges through resistors 54 and 51 to terminal 32, reducing the gate potential $V_G$ of N-MOSFET 42 as shown in interval B. With the above circuit constants, if the threshold voltage $V_{TN}$ of N-MOSFET 42 is 0.7 V, then $V_G - V_{SS}$ is reduced to $V_{TN}$ in approximately 5.4 microseconds.

In interval C N-MOSFET 42 turns off, and the output voltage $V_O$ at output terminal 33 is now pulled up through resistor 52 to the $V_{DD}$ level, resulting in output of a reset signal. Since P-MOSFET 44 and N-MOSFET 42 are turned off, current completely ceases to flow through the auto-reset circuit, permitting accurate measurement of static current consumption in the reset state.

When control signal CS1 goes low again, $V_G$ rises and $V_O$ falls as illustrated in intervals D and E, and the circuit returns to the steady state.

30TH EMBODIMENT

Figure 61:
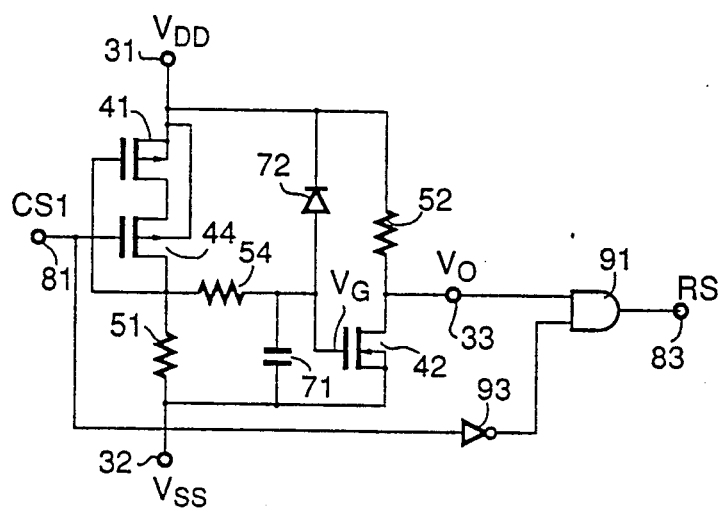
FIG. 61 is a circuit diagram of an auto-reset circuit illustrating a thirtieth embodiment of the invention.

FIG. 61 is a circuit diagram of an auto-reset circuit illustrating a thirtieth embodiment of the invention. Elements identical to elements of the twenty-ninth embodiment shown in FIG. 59 have the same reference numerals.

In this embodiment the first input terminal of a two-input AND gate 91 is coupled to the output terminal 33, as in the thirteenth embodiment shown in FIG. 33. The second input terminal of AND gate 91 is coupled through an inverter 93 to control signal input terminal 81. The output side of AND gate 91 is coupled to an output terminal 83 for output of the reset signal RS.

Figure 62:
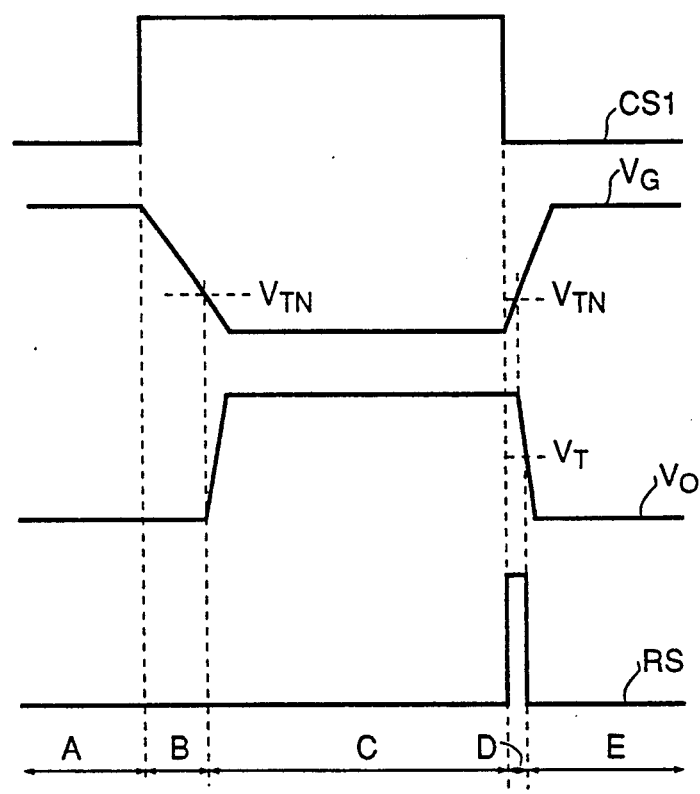
FIG. 62 is a voltage waveform diagram illustrating the operation of FIG. 61.

Referring to FIG. 62, the operation of this embodiment is identical to the operation of the twenty-ninth embodiment except that when control signal CS1 goes high, inverter 93 supplies a low input to AND gate 91, preventing output of a reset signal from output terminal 83. A reset signal is output only in interval D after CS1 goes low again, and lasts only until $V_G - V_{SS}$ regains the $V_{TN}$ level and N-MOSFET 42 turns on. The pulse width of this reset signal RS is determined by the time constant of resistor 54 and capacitor 71.

The thirtieth embodiment enables static current consumption to be measured accurately without output of a reset signal during interval C. After the measurement, when CS1 is driven low again, a further check of circuit operation can be made by confirming that the reset signal RS is output normally in interval D.

31ST EMBODIMENT

Figure 63:
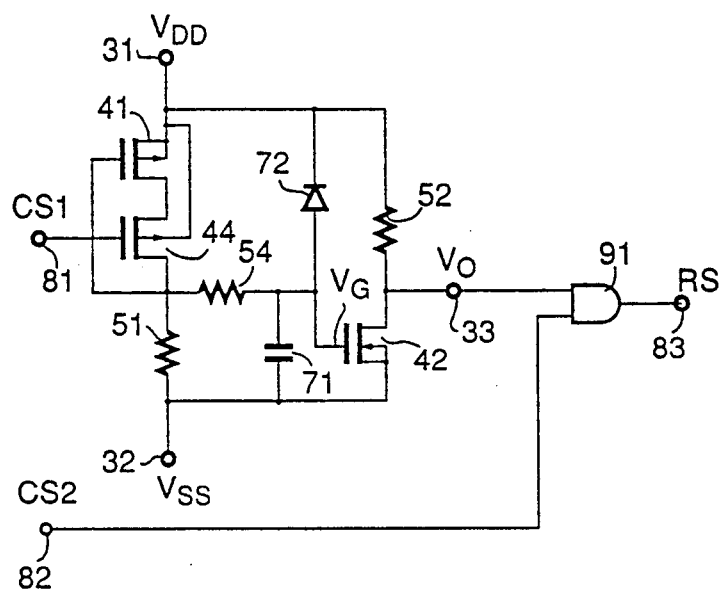
FIG. 63 is a circuit diagram of an auto-reset circuit illustrating a thirty-first embodiment of the invention.

FIG. 63 is a circuit diagram of an auto-reset circuit illustrating a thirty-first embodiment of the invention. Elements identical to elements of the thirtieth embodiment shown in FIG. 61 have the same reference numerals.

This embodiment is the same as the thirtieth except that the inverter 93 of FIG. 61 is not present and the second input terminal of AND gate 91 is connected to a second control signal input terminal 82. The control signals input at terminals 81 and 82 are designated CS1 and CS2, respectively.

Figure 64:
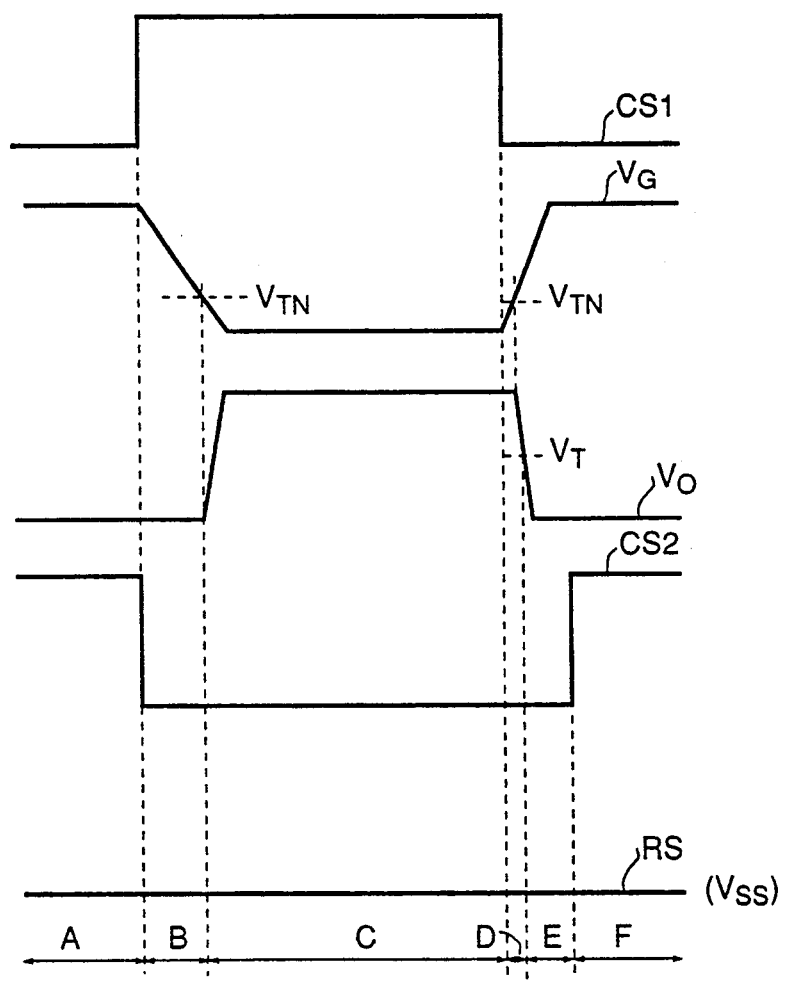
FIG. 64 is a voltage waveform diagram illustrating the operation of FIG. 63.

Referring to FIG. 64, this embodiment operates like the thirtieth except that now, to measure static current consumption, control signal CS1 is driven high and control signal CS2 is driven low in intervals B and C. At the end of the measurement, control signal CS1 is returned to the low level, then after a suitable delay spanning intervals D and E, control signal CS2 is returned to the high level.

Control signal CS1 turns off P-MOSFET 44 in intervals B and C and N-MOSFET 42 in interval C, reducing current flow to zero. Control signal CS2 forces the output of AND gate 91 low and suppresses output of a reset signal during intervals B, C, D, and E. Static current consumption can thus be measured accurately and without output of any reset signal, either during or after the measurement, enabling the device under test to resume operating from the state preceding the measurement.

32ND EMBODIMENT

Figure 65:
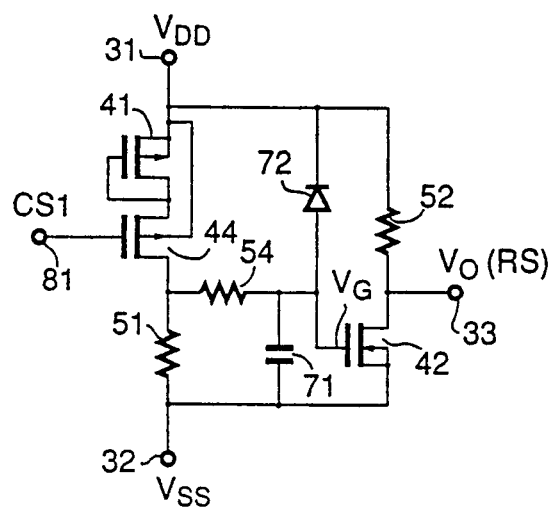
FIG. 65 is a circuit diagram of an auto-reset circuit illustrating a thirty-second embodiment of the invention.

FIG. 65 is a circuit diagram of an auto-reset circuit illustrating a thirty-second embodiment of the invention. Elements identical to elements of the twenty-ninth embodiment shown in FIG. 59 have the same reference numerals.

This embodiment has the same circuit topology as the twenty-ninth except that the gate of P-MOSFET 41 is now coupled directly to the drain of P-MOSFET 41, and the gate and drain of P-MOSFET 41 are both coupled to the source of P-MOSFET 44.

This embodiment operates in substantially the same way as the twenty-ninth. When control signal CS1 is low, P-MOSFET 44 turns on and the circuit is functionally the same as the circuit of FIG. 53, which illustrates the twenty-seventh embodiment. When CS1 is high, P-MOSFET 44 turns off, capacitor 71 discharges, N-MOSFET 42 turns off, and current flow is reduced to zero as in the twenty-ninth embodiment.

33RD EMBODIMENT

Figure 66:
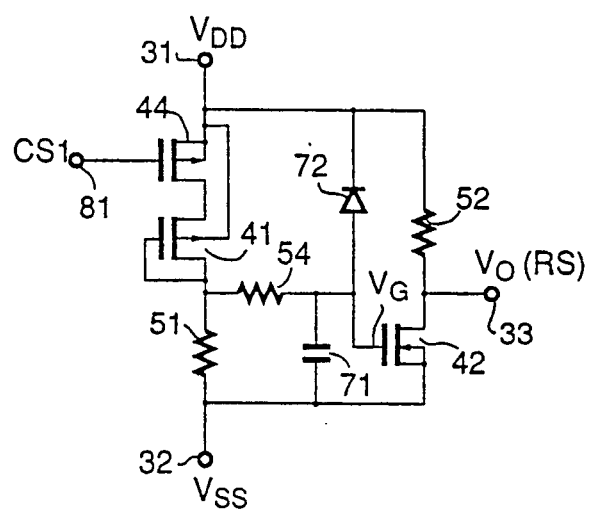
FIG. 66 is a circuit diagram of an auto-reset circuit illustrating a thirty-third embodiment of the invention.

FIG. 66 is a circuit diagram of an auto-reset circuit illustrating a thirty-third embodiment of the invention. Elements identical to elements of the twenty-ninth embodiment shown in FIG. 59 have the same reference numerals.

The difference between this embodiment and the twenty-ninth is that P-MOSFET 44 is now coupled in series between the first power-supply terminal 31 and the source of P-MOSFET 41. The first power-supply terminal 31 is connected to the source of P-MOSFET 44, the drain of P-MOSFET 44 is coupled to the source of P-MOSFET 41, and the gate of P-MOSFET 44 is coupled to control signal input terminal 81. The gate and drain of P-MOSFET 41 are mutually interconnected, and are coupled to a point between resistors 51 and 54.

This embodiment operates in the same way as the twenty-ninth and thirty-second, current flow being cut off when control signal CS1 is high. When CS1 is low the circuit operates normally, as in the twenty-seventh embodiment.

34TH EMBODIMENT

Figure 67:
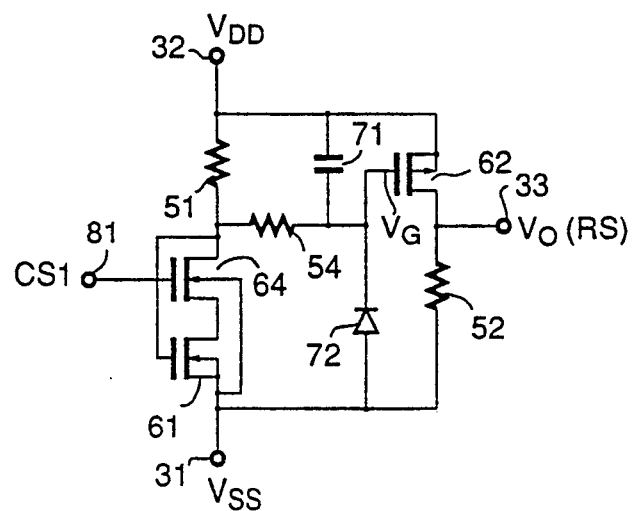
FIG. 67 is a circuit diagram of an auto-reset circuit illustrating a thirty-fourth embodiment of the invention.

FIG. 67 is a circuit diagram of an auto-reset circuit illustrating a thirty-fourth embodiment of the invention. Elements identical to elements of the twenty-eighth embodiment shown in FIG. 56 have the same reference numerals.

This embodiment is identical to the twenty-ninth with the replacement of P-MOSFET 41 by N-MOSFET 61, P-MOSFET 44 by N-MOSFET 64, and N-MOSFET 42 by P-MOSFET 62. Also, $V_{SS}$ is applied to the first power-supply terminal 31, $V_{DD}$ is applied to the second power-supply terminal 32, and the direction of diode 72 is reversed.

Figure 68:
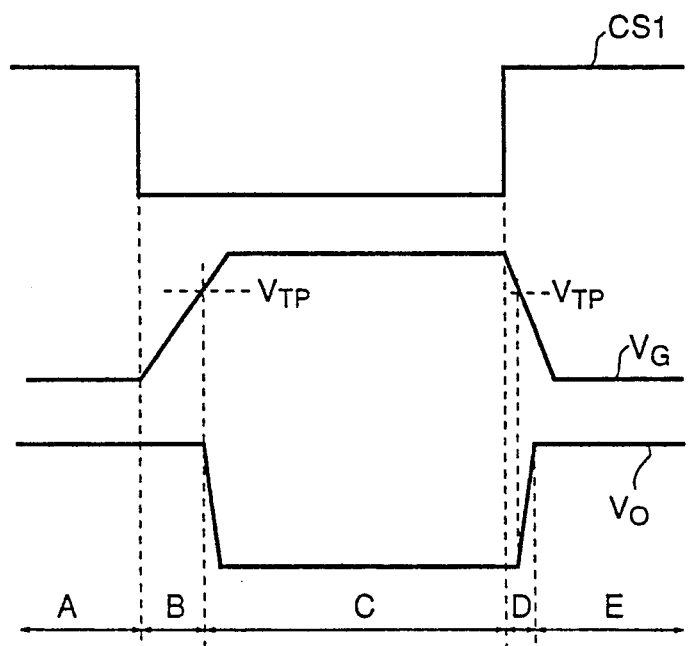
FIG. 68 is a voltage waveform diagram illustrating the operation of FIG. 67.

The operation of this embodiment is illustrated in FIGS. 57, 58, and 68. With a positive-negative reversal, it is exactly analogous to the operation of the twenty-ninth embodiment as illustrated in FIGS. 54, 55, and 60, so a detailed description will be omitted. Control signal CS1 low is normally high, but is driven low to cut off current flow for static current measurements.

35TH EMBODIMENT

Figure 69:
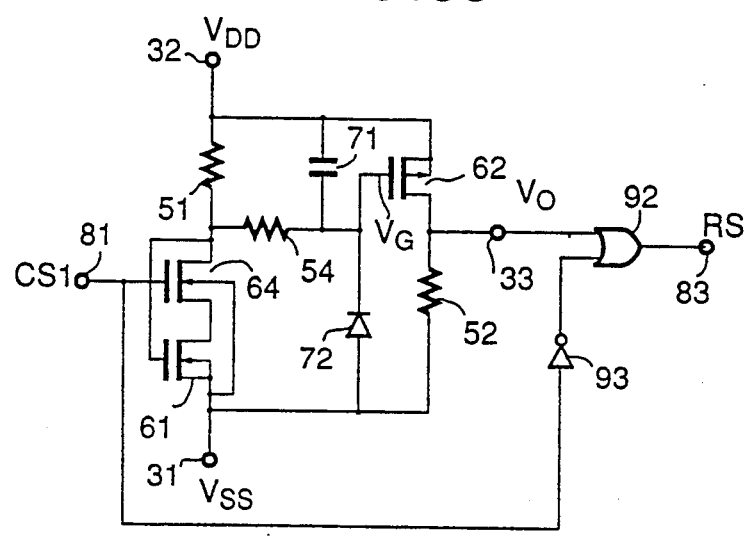
FIG. 69 is a circuit diagram of an auto-reset circuit illustrating a thirty-fifth embodiment of the invention.

FIG. 69 is a circuit diagram of an auto-reset circuit illustrating a thirty-fifth embodiment of the invention. Elements identical to elements of the thirty-fourth embodiment shown in FIG. 67 have the same reference numerals.

This embodiment is identical to the thirtieth with the replacement of P-MOSFET 41 by N-MOSFET 61, P-MOSFET 44 by N-MOSFET 64, N-MOSFET 42 by P-MOSFET 62, and AND gate 91 by OR gate 92. Also, $V_{SS}$ is applied to the first power-supply terminal 31, $V_{DD}$ is applied to the second power-supply terminal 32, and the direction of diode 72 is reversed.

Figure 70:
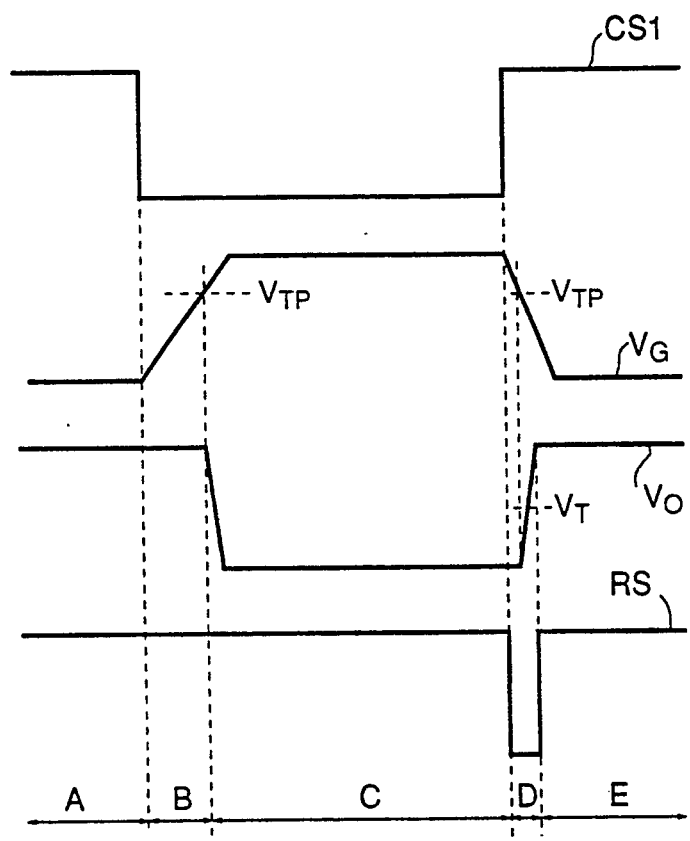
FIG. 70 is a voltage waveform diagram illustrating the operation of FIG. 69.

Referring to FIG. 70, the operation of this embodiment is exactly analogous to the operation of the thirtieth embodiment as illustrated in FIG. 62, with a positive-negative reversal. Control signal CS1 is normally high, but is driven low to cut off current flow for measurements of static current consumption. Inverter 93 and OR gate 92 prevent output of a reset signal in interval C.

36TH EMBODIMENT

Figure 71:
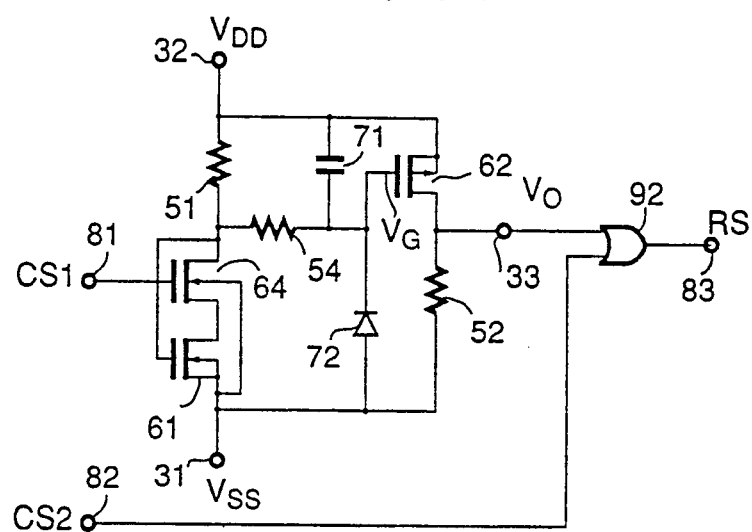
FIG. 71 is a circuit diagram of an auto-reset circuit illustrating a thirty-sixth embodiment of the invention.

FIG. 71 is a circuit diagram of an auto-reset circuit illustrating a thirty-sixth embodiment of the invention. Elements identical to elements of the thirty-fourth embodiment shown in FIG. 67 have the same reference numerals.

This embodiment is the same as the thirty-first with the replacement, again, of P-MOSFET 41 by N-MOSFET 61, P-MOSFET 44 by N-MOSFET 64, N-MOSFET 42 by P-MOSFET 62, and AND gate 91 by OR gate 92. Also, $V_{SS}$ is applied to the first power-supply terminal 31, $V_{DD}$ is applied to the second power-supply terminal 32, and the direction of diode 72 is reversed.

Figure 72:
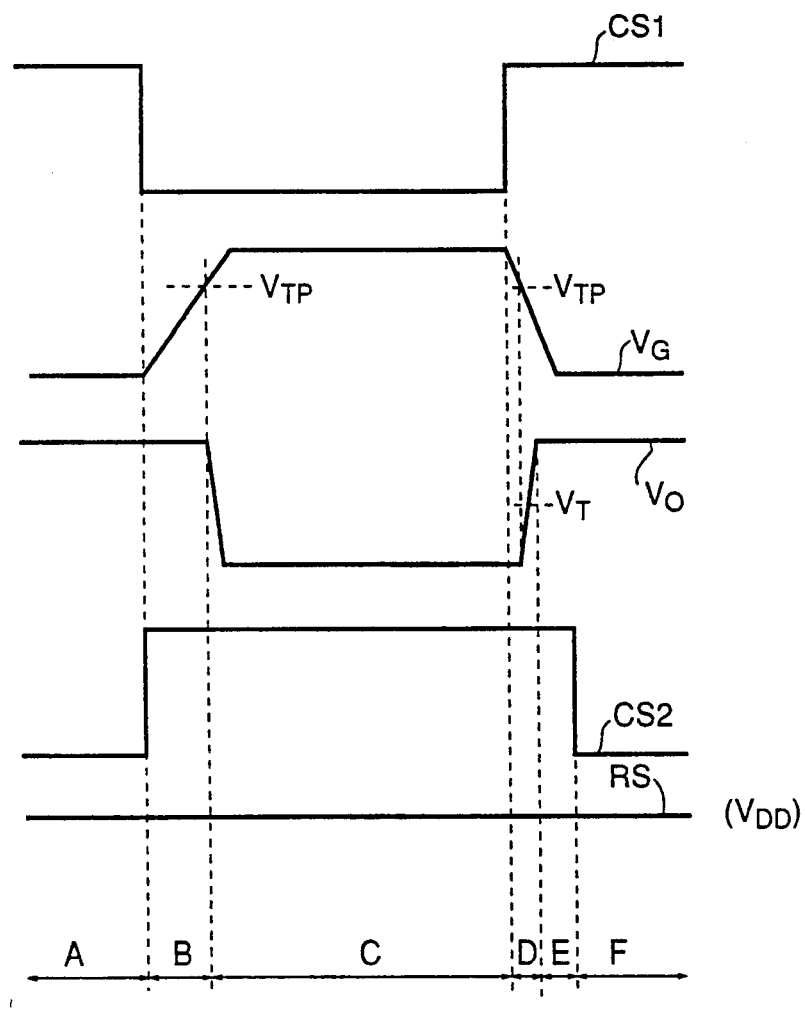
FIG. 72 is a voltage waveform diagram illustrating the operation of FIG. 71.

Referring to FIG. 72, the operation of this embodiment exactly analogous to the operation of the thirty-first embodiment as illustrated in FIG. 64, with a positive-negative reversal. Normally control signal CS1 is high and control signal CS2 low. For static current consumption measurements, control signal CS2 is driven low and control signal CS2 high. At the end of the measurement, first control signal CS1 is driven high, then control signal CS2 is driven low, preventing output of a reset signal either during or after the measurement.

37TH EMBODIMENT

Figure 73:
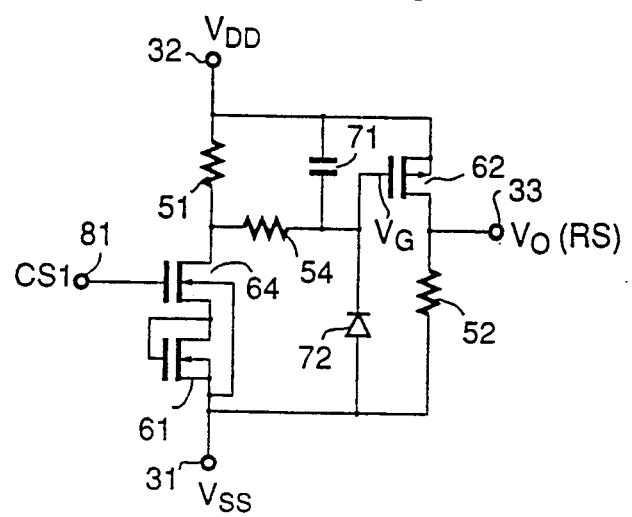
FIG. 73 is a circuit diagram of an auto-reset circuit illustrating a thirty-seventh embodiment of the invention.

FIG. 73 is a circuit diagram of an auto-reset circuit illustrating a thirty-seventh embodiment of the invention. Elements identical to elements of the thirty-fourth embodiment shown in FIG. 67 have the same reference numerals.

The only difference between this embodiment and the thirty-fourth is that the gate of N-MOSFET 61 is coupled to the drain of N-MOSFET 61 instead of the drain of N-MOSFET 64. As explained in the thirty-second embodiment, this difference does not change the operation of the circuit, a detailed description of which will therefore be omitted.

38TH EMBODIMENT

Figure 74:
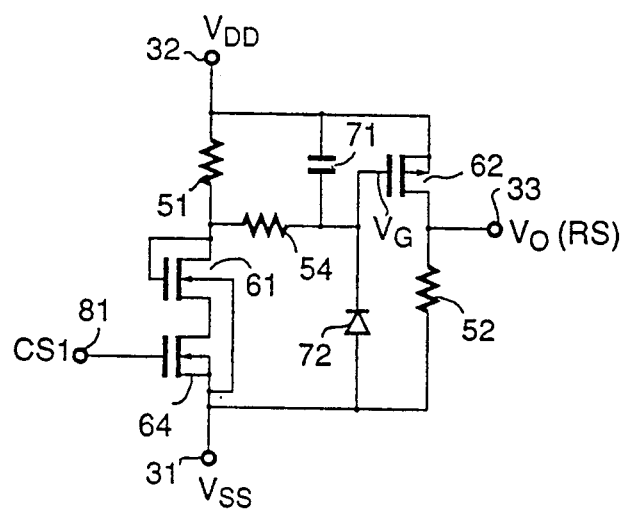
FIG. 74 is a circuit diagram of an auto-reset circuit, illustrating a thirty-eighth embodiment of the invention.

FIG. 74 is a circuit diagram of an auto-reset circuit illustrating a thirty-eighth embodiment of the invention. Elements identical to elements of the thirty-seventh embodiment shown in FIG. 73 have the same reference numerals.

In this embodiment N-MOSFET 64 is coupled in series between the first power-supply terminal 31 and the source of N-MOSFET 61. As explained in the thirty-third embodiment this change also does not affect the operation of the circuit, a description of which will therefore be omitted.

The twenty-ninth to thirty-eighth embodiments enable current flow to be stopped for measurement purposes by applying a control signal CS1. However, current flow does not stop immediately when the control signal is applied; there is a delay, as shown in interval B in FIGS. 60, 62, 64, 68, 70, and 72, before capacitor 71 can discharge to the threshold voltage of N-MOSFET 42 or P-MOSFET 62. If capacitor 71 has a capacitance of 3 picofarads and resistors 51 and 54 a resistance of 500 kilohms each, and the steady-state supply voltage is five volts, then the delay is about 5.4 microseconds. In general, the delay is on the order of a few microseconds to a few tens of microseconds. Since automatic test equipment may operate at megahertz rates or faster, this delay is not insignificant. The delay can be eliminated by means of a fourth three-terminal active element, as will be shown in the thirty-ninth to forty-fourth embodiments.

39TH EMBODIMENT

Figure 75:
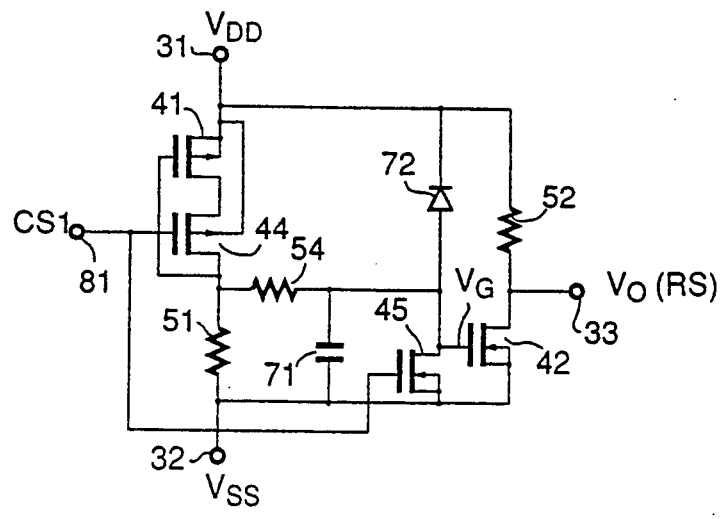
FIG. 75 is a circuit diagram of an auto-reset circuit illustrating a thirty-ninth embodiment of the invention.

FIG. 75 is a circuit diagram of an auto-reset circuit illustrating a thirty-ninth embodiment of the invention. Elements identical to elements of the twenty-ninth embodiment shown in FIG. 59 have the same reference numerals.

In this embodiment the fourth active element is an N-MOSFET 45. The drain of N-MOSFET 45 is coupled to the gate of N-MOSFET 42. The source of N-MOSFET 45 is coupled to power-supply terminal 32, which is at the $V_{SS}$ level, and the well or substrate in which N-MOSFET 45 is formed is also biased to this level. The gate of N-MOSFET 45 is coupled to control signal input terminal 81.

When control signal CS1 is low, P-MOSFET 44 is on and N-MOSFET 45 is off and the circuit becomes equivalent to the twenty-seventh embodiment shown in FIG. 53; that is, it operates as in FIGS. 54 and 55.

Figure 76:
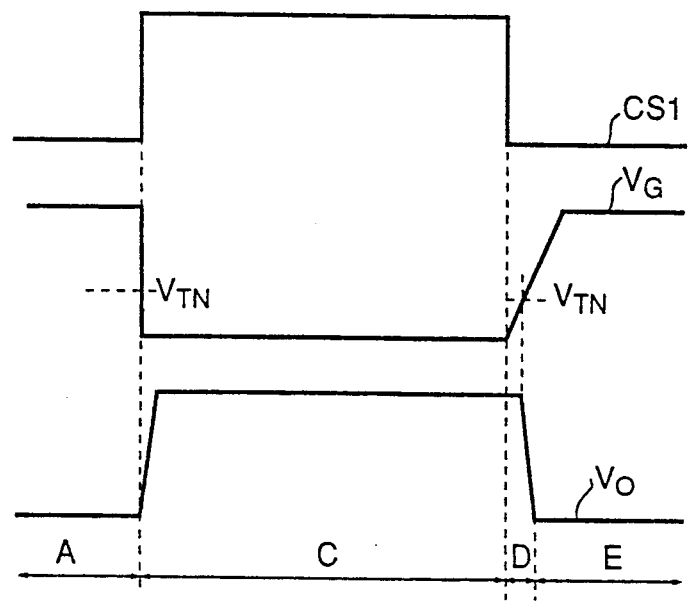
FIG. 76 is a voltage waveform diagram illustrating the operation of FIG. 75.

Referring to FIG. 76, when control signal CS1 goes high at the beginning of interval C, P-MOSFET 44 turns off and N-MOSFET 45 turns on. Capacitor 71 now discharges very rapidly through N-MOSFET 45 to the second power-supply terminal 32, and the gate potential $V_G$ of N-MOSFET 42 quickly falls to the $V_{SS}$ level. If capacitor 71 has a capacitance of about 3 picofarads, for example, the discharge time is several nanoseconds, only about 0.1% of the discharge time in the twenty-ninth to thirty-eighth embodiments, which was measured in microseconds. N-MOSFET 42 therefore turns off almost immediately, and with P-MOSFET 44 also off, current flow through the auto-reset circuit ceases. Since N-MOSFET 42 is off, the output voltage $V_O$ goes to the $V_{DD}$ level and a high reset signal is output.

In interval D, when control signal CS1 goes low again, P-MOSFET 44 turns on and N-MOSFET 45 turns off. Capacitor 71 now begins to charge through P-MOSFETs 41 and 44 and resistor 54, and the gate potential $V_G$ of N-MOSFET 42 begins to rise. When $V_G - V_{SS}$ exceeds the threshold voltage $V_{TN}$ of N-MOSFET 42, the N-MOSFET 42 turns on and the output voltage $V_O$ falls quickly to the $V_{SS}$ level. Afterward, the gate potential $V_G$ continues rising to its steady-state level of $V_{DD} - V_{TP}$, as shown in interval E.

In this thirty-ninth embodiment, static current consumption can be measured within a few nanoseconds, or a few tens of nanoseconds, of the application of control signal CS1, as compared with 5.4 microseconds, for example, in the twenty-ninth embodiment.

40TH EMBODIMENT

Figure 77:
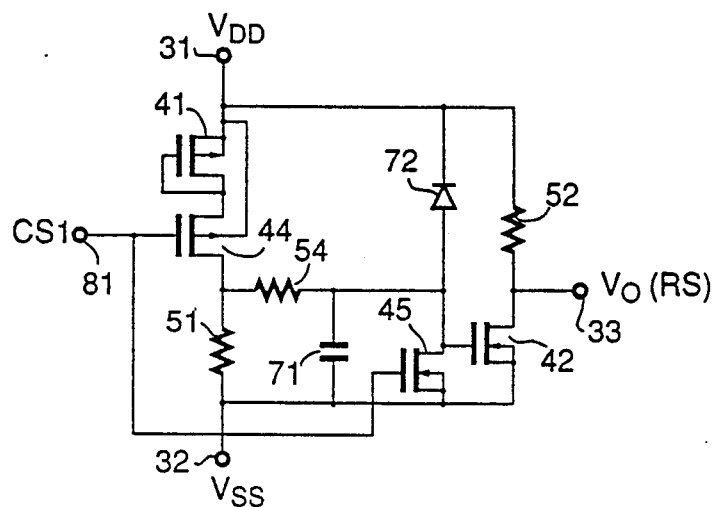
FIG. 77 is a circuit diagram of an auto-reset circuit illustrating a fortieth embodiment of the invention.

FIG. 77 is a circuit diagram of an auto-reset circuit illustrating a fortieth embodiment of the invention. Elements identical to elements of the thirty-second embodiment shown in FIG. 65 have the same reference numerals.

In this embodiment the same N-MOSFET 45 as in the thirty-ninth embodiment is coupled to the second power-supply terminal 32, the gate of N-MOSFET 42, and control signal input terminal 81. The same functions and effects are obtained as in the thirty-ninth embodiment.

41ST EMBODIMENT

Figure 78:
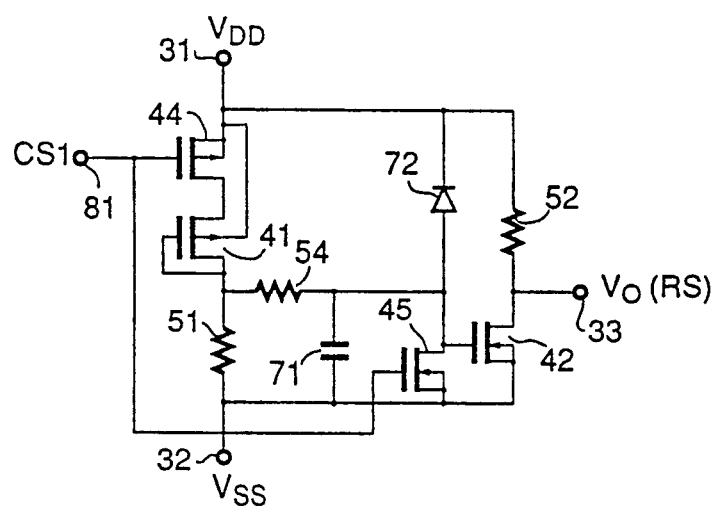
FIG. 78 is a circuit diagram of an auto-reset circuit illustrating a forty-first embodiment of the invention.

FIG. 78 is a circuit diagram of an auto-reset circuit illustrating a forty-first embodiment of the invention. Elements identical to elements of the thirty-third embodiment shown in FIG. 66 have the same reference numerals.

In this embodiment also, an N-MOSFET 45 is coupled to the second power-supply terminal 32, the gate of N-MOSFET 42, and control signal input terminal 81, providing the same functions and effects as in the thirty-ninth embodiment.

42ND EMBODIMENT

Figure 79:
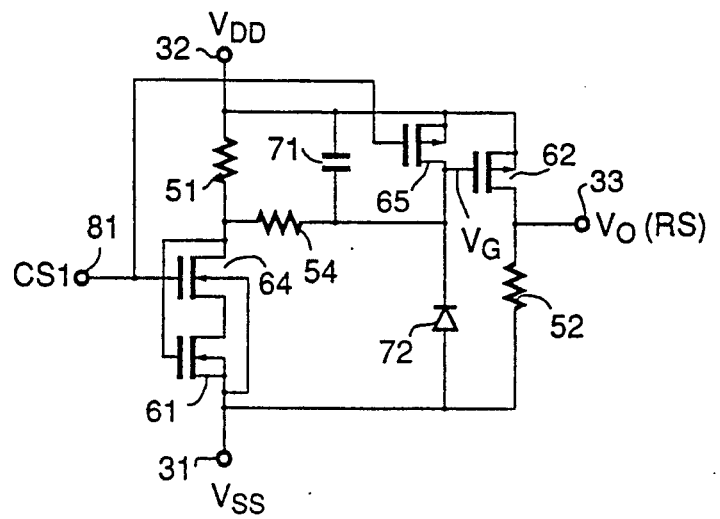
FIG. 79 is a circuit diagram of an auto-reset circuit illustrating a forty-second embodiment of the invention.

FIG. 79 is a circuit diagram of an auto-reset circuit illustrating a forty-second embodiment of the invention. Elements identical to elements of the thirty-fourth embodiment shown in FIG. 67 have the same reference numerals.

This embodiment is identical to the thirty-ninth with the replacement of P-MOSFETs 41 and 44 by N-MOSFETs 61 and 64, the replacement of N-MOSFETs 42 and 45 by P-MOSFETs 62 and 65, and the reversal of the direction of diode 72. $V_{SS}$ is applied to the first power-supply input terminal 31, and $V_{DD}$ to the second power-supply input terminal 32.

Figure 80:
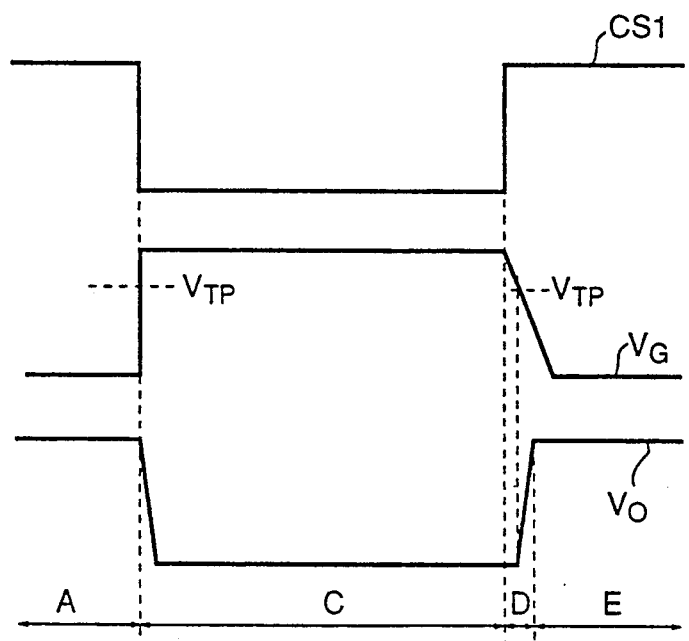
FIG. 80 is a voltage waveform diagram illustrating the operation of FIG. 79.

Referring to FIG. 80, the operation of this embodiment is exactly analogous to the operation of the thirty-ninth embodiment, with positive and negative reversed. Static current measurement can begin within a few nanoseconds, or a few tens of nanoseconds, of the application of control signal CS1.

43RD EMBODIMENT

Figure 81:
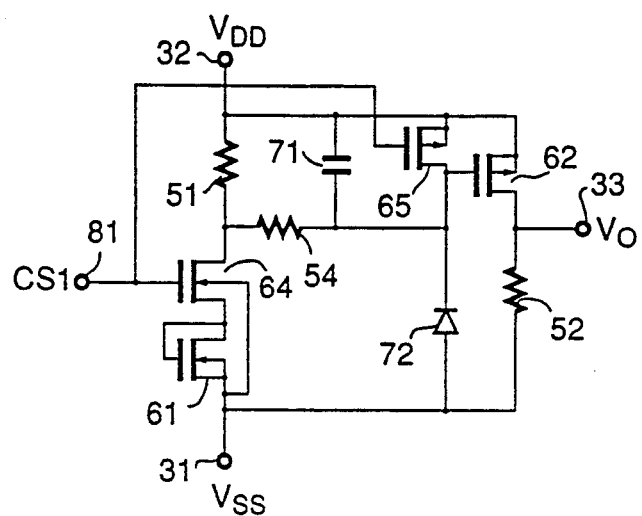
FIG. 81 is a circuit diagram of an auto-reset circuit illustrating a forty-third embodiment of the invention.

FIG. 81 is a circuit diagram of an auto-reset circuit illustrating a forty-third embodiment of the invention. Elements identical to elements of the thirty-seventh embodiment shown in FIG. 73 have the same reference numerals.

In this embodiment a P-MOSFET 65 is coupled to the second power-supply terminal 32, the gate of P-MOSFET 62, and control signal input terminal 81, with the same functions and effects as in the forty-second embodiment.

44TH EMBODIMENT

Figure 82:
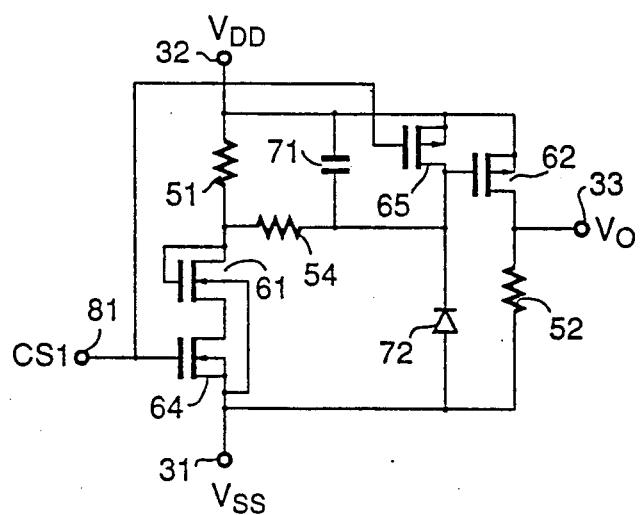
FIG. 82 is a circuit diagram of an auto-reset circuit illustrating a forty-fourth embodiment of the invention.

FIG. 82 is a circuit diagram of an auto-reset circuit illustrating a forty-fourth embodiment of the invention. Elements identical to elements of the thirty-eighth embodiment shown in FIG. 74 have the same reference numerals.

In this embodiment as well, a P-MOSFET 65 is coupled to the second power-supply terminal 32, the gate of P-MOSFET 62, and control signal input terminal 81, providing the same functions and effects as in the forty-second embodiment.

In all of the above embodiments, if resistors 51 and 52, or resistors 51, 52, and 53, have resistance values of about 500 kilohms and the supply voltage is 5 V, total steady-state current flow through the auto-reset circuit is between ten and twenty microamperes. This amount of current is insignificant in comparison with the current drawn by most LSI and other devices during operation. The invention accordingly can provide a reliable reset signal without dissipating excessive current.

As will be apparent to those skilled in the art, the preceding embodiments can be modified in further ways without departing from the spirit and scope of the invention. For example, an AND gate or OR gate can be added to the thirty-ninth through forty-fourth embodiments to suppress output of a reset signal during static current measurements, as was done in the thirtieth and thirty-fifth embodiments. The three-terminal active elements need not be MOSFETs; other active elements in which conduction between a first terminal and a second terminal is controlled by the input at a third terminal can be employed instead.

What is claimed is:

1. An auto-reset circuit for generating a power-up reset signal, comprising:
   a first power-supply terminal for receiving a first potential;
   a second power-supply terminal for receiving a second potential different from said first potential;
   an output terminal for output of the reset signal;
   a first active element having first and second terminals, and a third terminal for controlling conduction between the first and second terminals, the first terminal being coupled to said first power-supply terminal, the third terminal being coupled to said second power-supply terminal;
   a first resistor coupled between the second terminal of the first active element and said second power-supply terminal;
   a second resistor coupled between said first power-supply terminal and said output terminal;
   a second active element having first and second terminals, and a third terminal for controlling conduction between the first and second terminals, the first terminal being coupled to said second power-supply terminal, the second terminal being coupled to said output terminal, and the third terminal being coupled to the second terminal of the first active element;
   a third resistor coupled between the second terminal of the first active element and the third terminal of the second active element; and
   a capacitor coupled between the third terminal of the second active element and said second power-supply terminal.

2. The circuit of claim 1, further comprising a diode via which the third terminal of said second active element is coupled to said first power-supply terminal.

3. The circuit of claim 2, further comprising a fourth resistor coupled in series between the second terminal of the first active element and said first resistor, said fourth resistor also being coupled in series between the second terminal of said first active element and said third resistor.

4. The circuit of claim 1, further comprising a fourth resistor coupled in series between the second terminal of the first active element and said first resistor, said fourth resistor also being coupled in series between the second terminal of said first active element and said third resistor.

5. An auto-reset circuit for generating a power-up reset signal, comprising;
   a first power-supply terminal for receiving a first potential;
   a second power-supply terminal for receiving a second potential different from said first potential;
   an output terminal for output of the reset signal;
   a first control signal input terminal for input of a first control signal to halt current flow during static current measurements;
   a first active element having first and second terminals, and a third terminal for controlling conduction between the first and second terminals, the first terminal being coupled to said first power-supply terminal, and the third terminal being coupled to said first control signal input terminal;
   a first resistor coupled between the second terminal of the first active element and said second power-supply terminal;
   a second resistor coupled between said first power-supply terminal and said output terminal;
   a second active element having first and second terminals, and a third terminal for controlling conduction between the first terminal and second terminal, the first terminal of which is coupled to said second power-supply terminal, the second terminal of which is coupled to said output terminal and the third terminal of which is coupled to the second terminal of the first active element;
   a second control signal input terminal, for input of a second control signal to control output of said reset signal during static current measurements; and
   a logic gate having input terminals coupled to said output terminal and said second control signal input terminal, for gating said reset signal.

6. An auto-reset circuit for generating a power-up reset signal, comprising;
   a first power-supply terminal for receiving a first potential;
   a second power-supply terminal for receiving a second potential different from said first potential;
   an output terminal for output of the reset signal;

a first control signal input terminal for input of a first control signal to halt current flow during static current measurements;

a first active element having first and second terminals, and a third terminal for controlling conduction between the first and second terminals, the first terminal being coupled to said first power-supply terminal, and the third terminal being coupled to said first control signal input terminal;

a first resistor coupled between the second terminal of the first active element and said second power-supply terminal;

a second resistor coupled between said first power-supply terminal and said output terminal;

a second active element having first and second terminals, and a third terminal for controlling conduction between the first and second terminals, the first terminal being coupled to said second power-supply terminal, the second terminal being coupled to said output terminal, and the third terminal being coupled to the second terminal of the first active element;

a third resistor coupled between the second terminal of said first active element and the third terminal of said second active element; and a capacitor coupled between the third terminal of said second active element and said second power-supply terminal.

7. The circuit of claim 6, further comprising a third active element having a first terminal, a second terminal, and a third terminal for controlling conduction between the first terminal and second terminal, the first terminal of which is coupled to said second power-supply terminal, the second terminal of which is coupled to the third terminal of said second active element, and the third terminal of which is coupled to said first control signal input terminal, for discharging said capacitor prior to static current measurements.

8. The circuit of claim 7, further comprising a diode via which the third terminal of said second active element is cathode coupled to said first power-supply terminal.

9. The circuit of claim 8, further comprising a fourth resistor coupled in series between the second terminal of the first active element and said first resistor, said fourth resistor also being coupled in series between the second terminal of said first active element and the third terminal of said second active element.

10. The circuit of claim 7, further comprising a fourth resistor coupled in series between the second terminal of the first active element and said first resistor, said fourth resistor also being coupled in series between the second terminal of said first active element and said third resistor.

11. An auto-reset circuit for generating a power-up reset signal, comprising:

a first power-supply terminal for receiving a first potential;

a second power-supply terminal for receiving a second potential different from said first potential;

an output terminal for output of the reset signal;

a first active element having first and second terminals, and a third terminal for controlling conduction between the first terminal and second terminal, the first terminal being coupled to said first power-supply terminal, and the second terminal being coupled to the third terminal;

a first resistor coupled between the second terminal of said first active element and said second power-supply terminal;

a second resistor coupled between said first power-supply terminal and said output terminal;

a third resistor coupled to the second terminal of said first active element;

a capacitor coupled to said third resistor and said second power-supply terminal, said third resistor and said capacitor thus being coupled in series between the second terminal of said first active element and said second power-supply terminal; and a second active element having first and second terminals, and a third terminal for controlling conduction between the first and second terminals, the first terminal being coupled to said second power-supply terminal, the second terminal being coupled to said output terminal, and the third terminal being coupled to a circuit point between said third resistor and said capacitor.

12. The circuit of claim 11, further comprising a diode via which the third terminal of said second active element is coupled to said first power-supply terminal.

13. The circuit of claim 11, further comprising:

a first control signal input terminal for input of a first control signal to halt current flow during static current measurements; and a third active element having a first terminal, a second terminal, and a third terminal for controlling conduction between the first terminal and second terminal, the first terminal and second terminal of which are coupled in series with said first active element between said first power-supply terminal and said first resistor, and the third terminal of which is coupled to said first control signal input terminal.

14. The circuit of claim 13, further comprising:

an inverter coupled to receive and invert the first control signal from said first control signal input terminal; and a logic gate having input terminals coupled to said output terminal and said inverter, for gating said reset signal.

15. The circuit of claim 13, further comprising:

a second control signal input terminal, for input of a second control signal to control output of said reset signal during static current measurements; and a logic gate having input terminals coupled to said output terminal and said second control signal input terminal, for gating said reset signal.

16. The circuit of claim 13, further comprising a fourth active element having a first terminal, a second terminal, and a third terminal for controlling conduction between the first terminal and second terminal, the first terminal of which is coupled to said second power-supply terminal, the second terminal of which is coupled to the third terminal of said second active element, and the third terminal of which is coupled to said first control signal input terminal, for discharging said capacitor prior to static current measurements.

* * * * *